(12) United States Patent
You et al.

(10) Patent No.: US 11,488,948 B2
(45) Date of Patent: Nov. 1, 2022

(54) SEMICONDUCTOR DEVICES, LAYOUT DESIGN METHODS FOR THE SAME, AND METHODS FOR FABRICATING THE SAME

(71) Applicant: Samsung Electronics Co., Ltd., Suwon-si (KR)

(72) Inventors: Hyeon Gyu You, Hwaseong-si (KR); Ji Su Yu, Seoul (KR); Jae-Ho Park, Suwon-si (KR)

(73) Assignee: Samsung Electronics Co., Ltd.

( * ) Notice: Subject to any disclaimer, the term of this patent is extended or adjusted under 35 U.S.C. 154(b) by 65 days.

(21) Appl. No.: 17/109,912

(22) Filed: Dec. 2, 2020

(65) Prior Publication Data

US 2021/0305232 A1   Sep. 30, 2021

(30) Foreign Application Priority Data

Mar. 30, 2020  (KR) ........................ 10-2020-0038316
Jun. 30, 2020  (KR) ........................ 10-2020-0079973

(51) Int. Cl.
*H01L 27/02* (2006.01)
*H01L 27/092* (2006.01)
(Continued)

(52) U.S. Cl.
CPC ........ *H01L 27/0207* (2013.01); *G06F 30/392* (2020.01); *G06F 30/394* (2020.01);
(Continued)

(58) Field of Classification Search
CPC ............. H01L 27/0207; H01L 23/5286; H01L 27/092; H01L 29/0673; H01L 29/41733; H01L 29/41791; H01L 29/42392; H01L 29/7851; H01L 29/78696; H01L 21/823821; H01L 21/823871;
(Continued)

(56) References Cited

U.S. PATENT DOCUMENTS 7,919,793 B2   4/2011  Iwata
8,151,235 B2   4/2012  Chow et al.
(Continued)

FOREIGN PATENT DOCUMENTS

JP    3637125 B2    1/2005
JP    3705737 B2    8/2005
JP    2006165085 A  6/2006

*Primary Examiner* — Tong-Ho Kim
(74) *Attorney, Agent, or Firm* — Myers Bigel, P.A.

(57) ABSTRACT

A semiconductor device is provided. The semiconductor device includes a first cell region and a filler region that are adjacent each other in a first direction. The semiconductor device includes an active pattern extending in the first direction, inside the first cell region, a gate electrode extending in a second direction intersecting the first direction, on the active pattern, a gate contact electrically connected to an upper surface of the gate electrode, a source/drain contact electrically connected to a source/drain region of the active pattern, adjacent a side of the gate electrode, a connection wiring that extends in the first direction over the first cell region and the filler region, and is electrically connected to one of the gate contact or the source/drain contact, and a filler wiring that is inside the filler region. A related layout design method and fabricating method are also provided.

20 Claims, 32 Drawing Sheets

(51) Int. Cl.
*H01L 23/528* (2006.01)
*H01L 29/06* (2006.01)
*H01L 29/417* (2006.01)
*H01L 29/423* (2006.01)
*H01L 29/786* (2006.01)
*H01L 29/78* (2006.01)
*G06F 30/392* (2020.01)
*G06F 30/394* (2020.01)

(52) U.S. Cl.
CPC ........ *H01L 23/5286* (2013.01); *H01L 27/092* (2013.01); *H01L 29/0673* (2013.01); *H01L 29/41733* (2013.01); *H01L 29/41791* (2013.01); *H01L 29/42392* (2013.01); *H01L 29/7851* (2013.01); *H01L 29/78696* (2013.01)

(58) Field of Classification Search
CPC ........... H01L 27/0924; H01L 29/66439; H01L 29/775; H01L 23/528; G06F 30/392; G06F 30/394; B82Y 10/00
USPC ........................................................ 257/351
See application file for complete search history.

(56) References Cited

U.S. PATENT DOCUMENTS

| | | |
|---|---|---|
| 8,694,942 B2 | 4/2014 | Lin et al. |
| 10,331,838 B2 | 6/2019 | Yang et al. |
| 2021/0104611 A1* | 4/2021 | Yu .......................... H01L 29/785 |
| 2021/0151426 A1* | 5/2021 | Chae ................... H01L 27/0207 |

\* cited by examiner

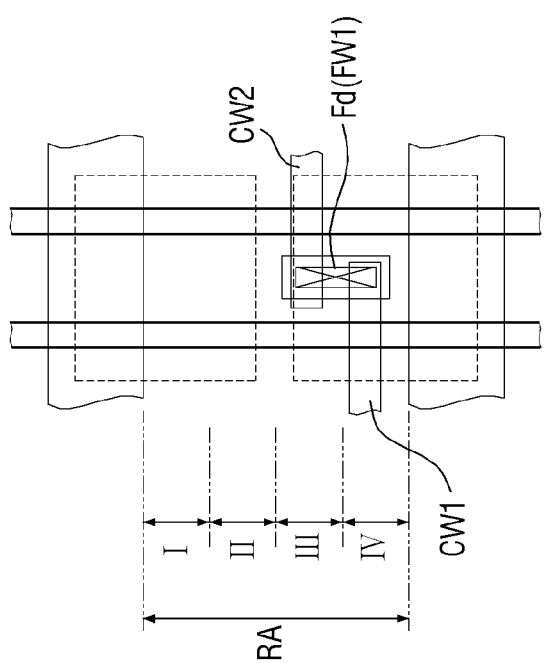

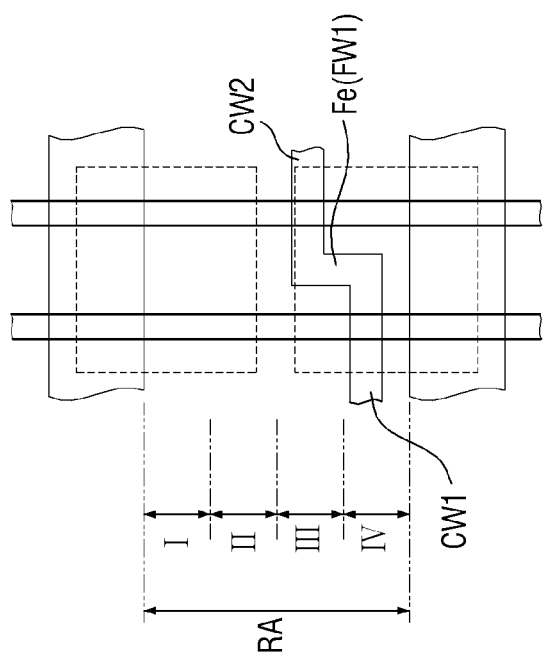

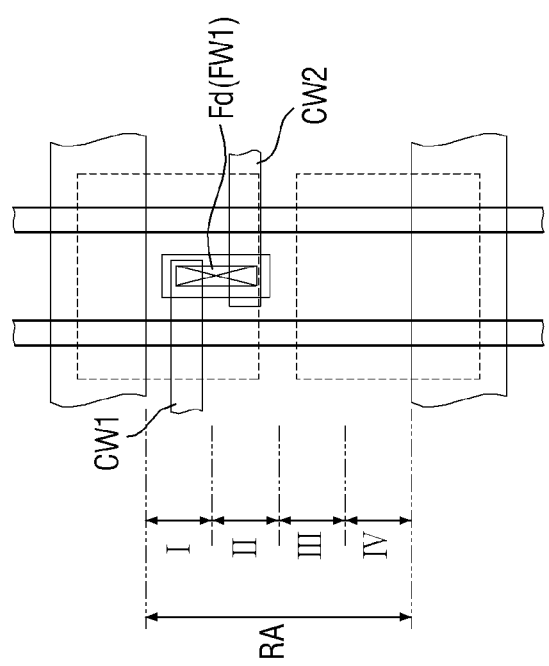

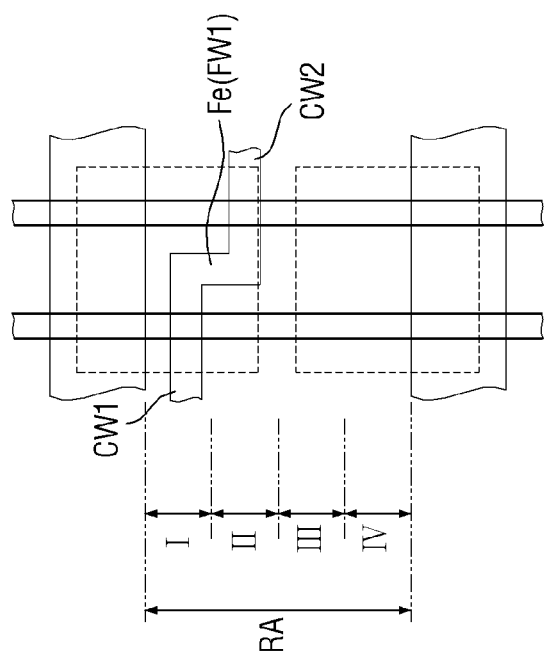

US 11,488,948 B2

SEMICONDUCTOR DEVICES, LAYOUT DESIGN METHODS FOR THE SAME, AND METHODS FOR FABRICATING THE SAME

REFERENCE TO PRIORITY APPLICATIONS

This application claims priority to Korean Patent Application No. 10-2020-0038316, filed on Mar. 30, 2020, and Korean Patent Application No. 10-2020-0079973, filed on Jun. 30, 2020, and all the benefits accruing therefrom under 35 U.S.C. § 119, the disclosures of which are incorporated herein by reference in their entireties.

BACKGROUND

1. Technical Field

The present disclosure relates to semiconductor devices.

2. Description of the Related Art

Due to characteristics such as miniaturization, multi-functionality and/or low fabricating cost, semiconductor devices have received attention as important factors in an electronic industry. Semiconductor devices may be classified into a semiconductor memory device that stores logical data, a semiconductor logic device that arithmetically processes the logical data, and a hybrid semiconductor device that includes a memory element and a logical element.

As the electronics industry is highly developed, demands for the characteristics of the semiconductor devices are gradually increasing. For example, demands for high reliability, high speed, and/or multi-functionality of the semiconductor devices are gradually increasing. In order to satisfy these required characteristics, the structures in the semiconductor device have become increasingly complex and highly integrated.

SUMMARY

Aspects of the present inventive concept provide a semiconductor device in which use of high level wiring is reduced and power loss and PnR (Placement and Routing) resource loss are reduced.

Aspects of the present inventive concept also provide a layout design method for a semiconductor device in which use of high level wiring is reduced and power loss and PnR resource loss are reduced.

Aspects of the present inventive concept also provide a method for fabricating a semiconductor device in which use of high level wiring is reduced and power loss and PnR resource loss are reduced.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a semiconductor device including a first cell region and a filler region that are adjacent each other in a first direction, the semiconductor device comprising an active pattern extending in the first direction, inside the first cell region, a gate electrode extending in a second direction intersecting the first direction, on the active pattern, a gate contact that is on and electrically connected to an upper surface of the gate electrode, a source/drain contact electrically connected to a source/drain region of the active pattern, adjacent a side of the gate electrode, a connection wiring that extends in the first direction over the first cell region and the filler region, and is on and electrically connected to one of the gate contact or the source/drain contact, and a filler wiring that extends in the second direction and is on and electrically connected to the connection wiring, inside the filler region, wherein an upper surface of the gate contact and an upper surface of the source/drain contact are coplanar, and a height of the upper surface of the filler wiring is equal to or lower than a height of an upper surface of the connection wiring.

According to an aspect of the present inventive concept, there is provided a semiconductor device that includes a first cell region and a second cell region that are spaced apart from each other in a first direction, and a filler region between the first cell region and the second cell region, the semiconductor device comprising a gate electrode extending in a second direction intersecting the first direction, inside the first cell region, a source/drain contact adjacent a side of the gate electrode, a first connection wiring that extends in the first direction over the first cell region and the filler region and that is on and electrically connected to the source/drain contact, a second gate electrode extending in the second direction, inside the second cell region, a gate contact that is on and electrically connected to an upper surface of the second gate electrode, a second connection wiring that extends in the first direction over the filler region and the second cell region and that is on and electrically connected to the gate contact, and a filler wiring extending in the second direction to connect the first connection wiring and the second connection wiring, inside the filler region, wherein the first connection wiring and the second connection wiring are at a first routing level, and the filler wiring is at a level that is lower than the first routing level.

According to an aspect of the present inventive concept, there is provided a semiconductor device comprising a first power supply wiring and a second power supply wiring that extend in parallel in a first direction, a first cell separation film, a second cell separation film, and a third cell separation film that are spaced apart from each other in the first direction and that extend in parallel in a second direction intersecting the first direction, a first active pattern extending in the first direction, between the first power supply wiring and the second power supply wiring, a first gate electrode extending in the second direction, between the first cell separation film and the second cell separation film, a first source/drain contact that is on and electrically connected to a first source/drain region of the first active pattern, adjacent a side of the first gate electrode, a first connection contact that is on and electrically connected to an upper surface of the first source/drain contact, a first routing via that is on and electrically connected to an upper surface of the first connection contact, a first routing wiring that extends in the first direction and that is on and electrically connected to an upper surface of the first routing via, a second routing via that is on and electrically connected to an upper surface of the first routing wiring, a second routing wiring that extends in the second direction and that is on and electrically connected to an upper surface of the second routing via, and a filler wiring that extends in the second direction and that is on and electrically connected to the first routing wiring, between the second cell separation film and the third cell separation film, wherein a height of an upper surface of the filler wiring is equal to or lower than a height of the upper surface of the first routing wiring.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

A semiconductor device according to some embodiments will be explained below with reference to FIGS. 1 to 6.

Although a fin type transistor (FinFET) including a fin type pattern-shaped channel region is shown as an example, the present disclosure is not limited thereto. The semiconductor device according to some embodiments may, for example, include a tunneling FET, a transistor including a nanowire, a transistor including a nanosheet, or a three-dimensional (3D) transistor. Also, the semiconductor device according to some embodiments of the present inventive concept may include a bipolar junction transistor, a laterally-diffused metal-oxide semiconductor (LDMOS), and the like.

Figure 1:
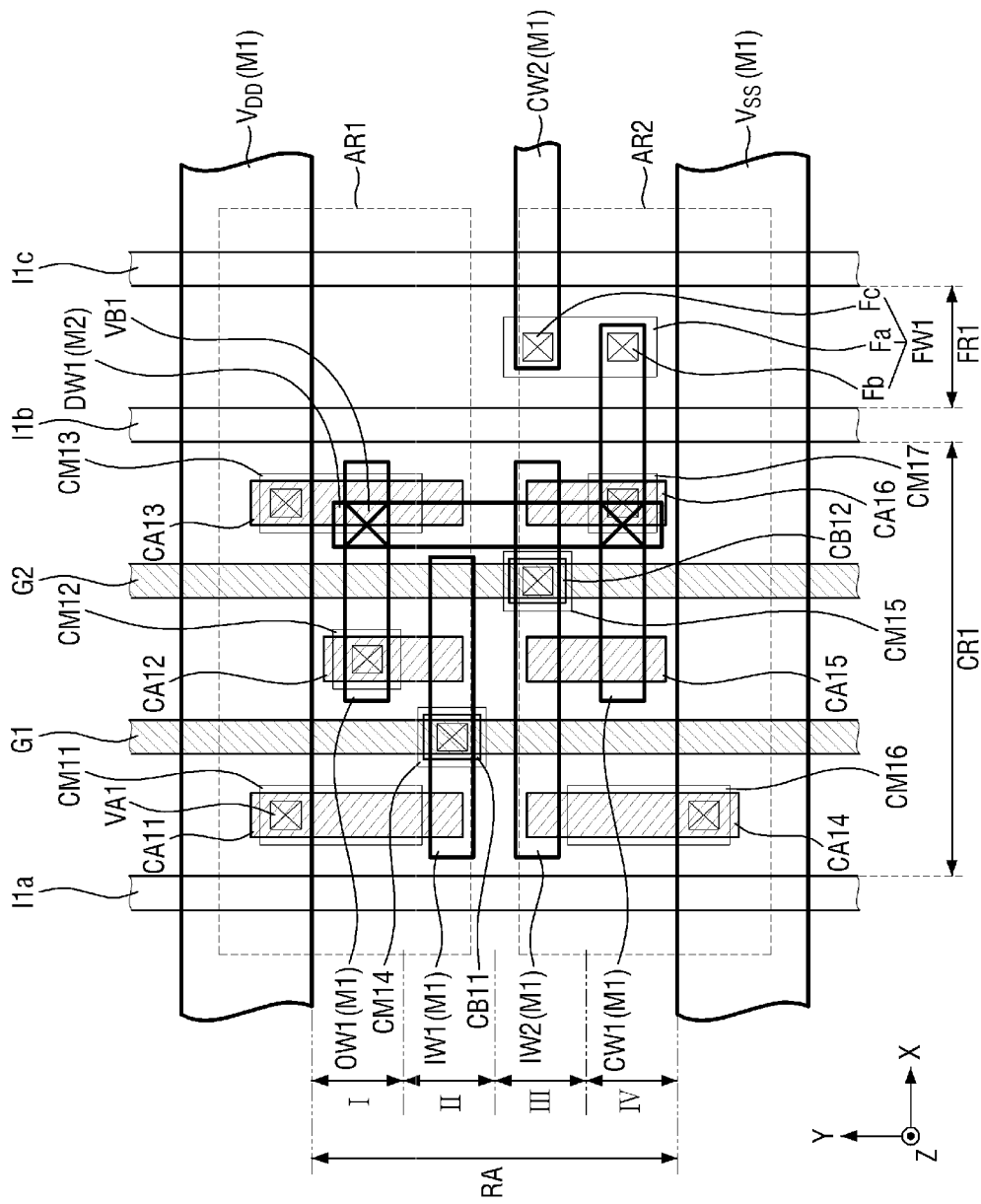
FIG. 1 is a layout diagram for explaining a semiconductor device according to some embodiments.

FIG. 1 is a layout diagram for explaining a semiconductor device according to some embodiments.

Referring to FIG. 1, the semiconductor device according to some embodiments includes a first cell region CR1 and a first filler region FR1.

A standard cell provided by a cell library may be provided in the first cell region CR1. In FIG. 1, the standard cell provided in the first cell region CR1 may be a NAND cell. However, this is merely an example, and the standard cell provided in the first cell region CR1 may, in some embodiments, be one of various types of cells, such as a NOR cell or an XOR cell. The first filler region FR1 may be a dummy cell region that is in (e.g., that fills) an empty space between the cell regions in which the standard cell is provided.

The first cell region CR1 and the first filler region FR1 may be adjacent to each other. Hereinafter, the first cell region CR1 and the first filler region FR1 will be explained as being arranged along a first direction X.

In some embodiments, the first cell region CR1 and the first filler region FR1 may be defined by a first cell separation film I1a, a second cell separation film I1b and a third cell separation film I1c which are sequentially arranged (e.g., spaced apart from each other) along the first direction X. For example, the first cell separation film I1a, the second cell separation film I1b, and the third cell separation film I1c may extend side by side (i.e., in parallel) in a second direction Y that intersects the first direction X. The first cell region CR1 may be defined between the first cell separation film I1a and the second cell separation film I1b. The first filler region FR1 may be defined between the second cell separation film I1b and the third cell separation film I1c. The second cell separation film I1b may separate the first cell region CR1 and the first filler region FR1.

In some embodiments, the second cell separation film I1b and the third cell separation film I1c may be spaced apart from each other by 1 gate pitch (1 contacted poly pitch (CPP)). For example, a spaced distance between the second cell separation film I1b and the third cell separation film I1c may be the same as a spaced distance between adjacent gate electrodes (for example, a first gate electrode G1 and a second gate electrode G2 to be explained below). In the present specification, the term "same" means not only the same thing but also a minute difference that may occur due to a process margin or the like.

In some embodiments, the second cell separation film I1b and the third cell separation film I1c may be cell separation films which are adjacent to each other. For example, another gate electrode or another cell separation film may not be placed between the second cell separation film I1b and the third cell separation film I1c.

In some embodiments, the spaced distance between the second cell separation film I1b and the third cell separation film I1c may be 60 nanometers (nm) or less. As an example, the spaced distance between the second cell separation film I1b and the third cell separation film I1c may be 50 nm to 60 nm.

A semiconductor device according to some embodiments may include a first active region AR1, a second active region AR2, a first gate electrode G1, a second gate electrode G2, a plurality of source/drain contacts CA11 to CA16, a plurality of gate contacts CB11 and CB12, a plurality of connection contacts CM11 to CM17, a first power supply wiring $V_{DD}$, a second power supply wiring $V_{SS}$, a plurality of first routing wirings OW1, IW1, IW2, and CW1, a second routing wiring DW1 and a first filler wiring FW1.

The first active region AR1 and the second active region AR2 may be spaced apart from each other and extend side by side. For example, the first active region AR1 and the second active region AR2 may each extend in the first direction X. The second active region AR2 may be spaced apart from the first active region AR1 in the second direction Y. In some embodiments, the first active region AR1 and the second active region AR2 may be formed over each of the first cell region CR1 and the first filler region FR1.

In some embodiments, semiconductor elements (e.g., transistors) of different conductivity types may be formed on the first active region AR1 and the second active region AR2. Hereinafter, it will be explained that the first active region AR1 is a PFET region and the second active region AR2 is an NFET region. However, this is only an example, and, in some embodiments, the first active region AR1 may be the NFET region and the second active region AR2 may be the PFET region.

The first gate electrode G1 and the second gate electrode G2 may be interposed between the first cell separation film I1a and the second cell separation film I1b. The first gate electrode G1 and the second gate electrode G2 may intersect each of the first active region AR1 and the second active region AR2. For example, the first gate electrode G1 and the second gate electrode G2 may extend side by side in the second direction Y.

In some embodiments, the first gate electrode G1 and the second gate electrode G2 may be spaced apart from each other by one gate pitch (1CPP). That is, the first gate electrode G1 and the second gate electrode G2 may be gate electrodes adjacent to each other. For example, another gate electrode or another cell separation film may not be placed between the first gate electrode G1 and the second gate electrode G2.

In some embodiments, the spaced distance between the adjacent gate electrode and the cell separation film (e.g., between the first gate electrode G1 and the first cell separation film I1a, or between the second gate electrode G2 and the second cell separation film I1b) may be the same as the spaced distance between adjacent gate electrodes (e.g., the first gate electrode G1 and the second gate electrode G2).

The plurality of source/drain contacts CA11 to CA16 may be placed on/adjacent both (e.g., opposite) sides of the first gate electrode G1 or the second gate electrode G2. The plurality of source/drain contacts CA11 to CA16 may be connected to the source/drain regions of the first active region AR1 or the second active region AR2. As used herein, the term "connected" may refer to an electrical connection.

For example, a first source/drain contact CA11 may be formed on the first active region AR1 between the first gate electrode G1 and the first cell separation film I1a. A second source/drain contact CA12 may be formed on the first active region AR1 between the first gate electrode G1 and the second gate electrode G2. A third source/drain contact CA13 may be formed on the first active region AR1 between the second gate electrode G2 and the second cell separation film I1b. A fourth source/drain contact CA14 may be formed on the second active region AR2 between the first gate electrode G1 and the first cell separation film I1a. A fifth source/drain contact CA15 may be formed on the second active region AR2 between the first gate electrode G1 and the second gate electrode G2. A sixth source/drain contact CA16 may be formed on the second active region AR2 between the second gate electrode G2 and the second cell separation film I1b.

The source/drain contacts CA11 to CA16 may be formed at a MOL (middle-of-line) process step. That is, the source/drain contacts CA11 to CA16 may be formed before a BEOL (back-end-of-line) process step.

The plurality of gate contacts CB11 and CB12 may be placed to overlap the first gate electrode G1 or the second gate electrode G2. Here, the overlap means overlapping in a direction Z that intersects the first direction X and the second direction Y. The plurality of gate contacts CB11 and CB12 may be connected to the first gate electrode G1 or the second gate electrode G2. For example, the first gate contact CB11 may be connected to and overlap the first gate electrode G1, and the second gate contact CB12 may be connected to and overlap the second gate electrode G2.

The gate contacts CB11 and CB12 may be formed at a MOL (middle-of-line) process step. That is, the gate contacts CB11 and CB12 may be formed before the BEOL (back-end-of-line) process step.

The plurality of connection contacts CM11 to CM17 may be connected to some of the source/drain contacts CA11 to CA16 or some of the gate contacts CB11 and CB12, respectively. For example, the plurality of connection contacts CM11 to CM17 may be placed to overlap some of source/drain contacts CA11 to CA16 or some of the gate contacts CB11 and CB12, respectively.

For example, a first connection contact CM11 may be connected to and overlap the first source/drain contact CA11. A second connection contact CM12 may be connected to and overlap the second source/drain contact CA12. A third connection contact CM13 may be connected to and overlap the third source/drain contact CA13. A fourth connection contact CM14 may be connected to and overlap the first gate contact CB11. A fifth connection contact CM15 may be connected to and overlap the second gate contact CB12. A sixth connection contact CM16 may be connected to and overlap the fourth source/drain contact CA14. A seventh connection contact CM17 may be connected to and overlap the sixth source/drain contact CA16.

The connection contacts CM11 to CM17 may be formed at the MOL process step. That is, the connection contacts CM11 to CM17 may be formed before the BEOL process step.

The first power supply wiring $V_{DD}$ and the second power supply wiring $V_{SS}$ may be spaced apart from each other and extend in parallel. For example, the first power supply wiring $V_{DD}$ and the second power supply wiring $V_{SS}$ may each extend in the first direction X. The second power supply wiring $V_{SS}$ may be spaced apart from the first power supply wiring $V_{DD}$ in the second direction Y. In some embodiments, the first power supply wiring $V_{DD}$ and the second power supply wiring $V_{SS}$ may be formed over each of the first cell region CR1 and the first filler region FR1.

The first power supply wiring $V_{DD}$ and the second power supply wiring $V_{SS}$ may provide a power supply voltage. In some embodiments, a drain voltage may be applied to the first power supply wiring $V_{DD}$ and a source voltage may be applied to the second power supply wiring $V_{SS}$. For example, although a positive (+) voltage may be applied to the first power supply wiring $V_{DD}$, and a ground voltage or a negative (−) voltage may be applied to the second power supply wiring $V_{SS}$, the present disclosure is not limited thereto.

In some embodiments, the first power supply wiring $V_{DD}$ may be connected to some of the source/drain contacts CA11 to CA16. For example, at least a part of the first connection contact CM11 may be placed to overlap the first power supply wiring $V_{DD}$, and a first routing via VA1 which connects the first connection contact CM11 and the first power supply wiring $V_{DD}$ may be formed. Therefore, the first source/drain contact CA11 may be connected to the first power supply wiring $V_{DD}$.

In some embodiments, the second power supply wiring $V_{SS}$ may be connected to some others of the source/drain contacts CA11 to CA16. For example, at least a part of the sixth connection contact CM16 may be placed to overlap the second power supply wiring $V_{SS}$, and a first routing via VA1 which connects the sixth connection contact CM16 and the second power supply wiring $V_{SS}$ may be formed. Accordingly, the fourth source/drain contact CA14 may be connected to the second power supply wiring $V_{SS}$.

The first power supply wiring $V_{DD}$ and the second power supply wiring $V_{SS}$ may be formed at the BEOL process step. In some embodiments, the first power supply wiring $V_{DD}$ and the second power supply wiring $V_{SS}$ may be formed at the same routing level as first routing wirings OW1, IW1, IW2, and CW1 to be explained below. For example, the first power supply wiring $V_{DD}$ and the second power supply wiring $V_{SS}$ may be placed at a first routing level M1 to be explained below.

Each of the plurality of first routing wirings OW1, IW1, IW2, and CW1 may extend in the first direction X to overlap some of the source/drain contacts CA11 to CA16 or some of the gate contacts CB11 and CB12. For example, the plurality of first routing wirings OW1, IW1, IW2, and CW1 may be placed to overlap some of the source/drain contacts CA11 to CA16 or some of the gate contacts CB11 and CB12, respectively.

The plurality of first routing wirings OW1, IW1, IW2, and CW1 may be placed between the first power supply wiring $V_{DD}$ and the second power supply wiring $V_{SS}$. For example, a routing region RA may be defined between the first power supply wiring $V_{DD}$ and the second power supply wiring $V_{SS}$. For example, first to fourth routing regions I to IV sequentially arranged along the second direction Y may be formed between the first power supply wiring $V_{DD}$ and the second power supply wiring $V_{SS}$. The respective first routing wirings OW1, IW1, IW2, and CW1 may be placed in one of the first to fourth routing regions I to IV.

For example, the first output wiring OW1 may be placed in the first routing region I to overlap the second connection contact CM12. Also, a first routing via VA1 which connects the second connection contact CM12 and the first output wiring OW1 may be formed. Therefore, the second source/drain contact CA12 may be connected to the first output wiring OW1.

The first input wiring IW1 may be placed in the second routing region II to overlap the fourth connection contact CM14. Also, a first routing via VA1 that connects the fourth connection contact CM14 and a first input wiring IW1 may be formed. Accordingly, a first gate contact CB11 may be connected to the first input wiring IW1. The first input wiring IW1 may function as an input wiring that provides a first input signal to the first cell region CR1.

The second input wiring IW2 may be placed in the third routing region III to overlap the fifth connection contact CM15. Also, a first routing via VA1 which connects the fifth connection contact CM15 and the second input wiring IW2 may be formed. As a result, the second gate contact CB12 may be connected to the second input wiring IW2. The second input wiring IW2 may function as an input wiring that provides a second input signal to the first cell region CR1.

The first connection wiring CW1 may be placed in the fourth routing region IV to overlap the seventh connection contact CM17. Further, a first routing via VA1 which connects the seventh connection contact CM17 and the first connection wiring CW1 may be formed. Therefore, the sixth source/drain contact CA16 may be connected to the first connection wiring CW1. The first connection wiring CW1 may function as an output wiring that provides an output signal of the first cell region CR1.

The first routing wirings OW1, IW1, IW2, and CW1 may be formed at the BEOL process step. The first routing wirings OW1, IW1, IW2, and CW1 may be formed at the same routing level as each other. For example, the first routing wirings OW1, IW1, IW2, and CW1 may be placed at the first routing level M1. In some embodiments, the first routing level M1 may be a routing level placed at the lowest level among the wirings formed at the BEOL process step.

The second routing wirings DW1 may extend in the second direction Y and be connected to some of the first routing wirings OW1, IW1, IW2, and CW1. For example, the second routing wiring DW1 may be placed to overlap some of the first routing wirings OW1, IW1, IW2, and CW1.

For example, the second routing wirings DW1 may extend in the second direction Y to overlap the first output wiring OW1 and the first connection wiring CW1. Also, a second routing via VB1 which connects the first output wiring OW1 and the second routing wiring DW1, and a second routing via VB1 which connects the first connection wiring CW1 and the second routing wiring DW1 may be formed. Accordingly, the second source/drain contact CA12 may be connected to the sixth source/drain contact CA16. Also, the first connection wiring CW1 (and the second routing wiring DW1) may function as an output wiring that provides an output signal of the first cell region CR1.

The second routing wiring DW1 may be formed at the BEOL process step. The second routing wirings DW1 may be formed at a higher level than the first routing wirings OW1, IW1, IW2, and CW1. For example, the second routing wiring DW1 may be placed at a second routing level M2 higher than the first routing level M1.

The first filler wiring FW1 may be placed in (e.g., may be confined to) the first filler region FR1. For example, the first filler wiring FW1 may be interposed between the second cell separation film I1b and the third cell separation film I1c. The first filler wiring FW1 may extend in the second direction Y and be connected to some of the first routing wirings OW1, IW1, IW2, and CW1. For example, the first filler wiring FW1 may extend in the second direction Y to overlap the first connection wiring CW1.

The first filler wiring FW1 may be formed at the same level as or a level lower than the first routing wirings OW1, IW1, IW2, and CW1. For example, the first filler wiring FW1 may be placed at a level lower than the first routing level M1.

The first routing wirings OW1, IW1, IW2, and CW1 of the first cell region CR1 may be routed to other cell regions through the first filler wiring FW1. For example, the first filler wiring FW1 may extend in the second direction Y over a third routing region III and a fourth routing region IV. Also, a second connection wiring CW2 connected to the first filler wiring FW1 may be formed in the third routing region III. Accordingly, the first cell region CR1 may provide an output signal to another cell region through the first filler wiring FW1 and the second connection wiring CW2.

Although FIG. 1 shows that the second connection wiring CW2 is only placed in the third routing region III, this is merely an example. For example, the second connection wiring CW2 may be placed in the first routing region I or the second routing region II. Accordingly, the output signal of the first cell region CR1 may be provided to other cell regions in various routing regions.

Although FIG. 1 shows that the first filler wiring FW1 is only connected to the first connection wiring CW1 of the first cell region CR1, this is merely an example. For example, the first filler wiring FW1 may be connected to the first input wiring IW1 or the second input wiring IW2 of the first cell region CR1. In such a case, the first cell region CR1 may receive an input signal from another cell region through the first filler wiring FW1 and the second connection wiring CW2.

In some embodiments, the second connection wiring CW2 may be formed at the same routing level as the first routing wirings OW1, IW1, IW2, and CW1. For example, the second connection wiring CW2 may be placed at the first routing level M1.

In some embodiments, the first filler wiring FW1 may include a filler contact Fa, a first filler via Fb and a second filler via Fc. The filler contact Fa may extend in the second direction Y to overlap the first connection wiring CW1. The first filler via Fb may connect the first connection wiring CW1 and the first filler wiring FW1. The second filler via Fc may connect the first filler wiring FW1 and the second connection wiring CW2. The filler contact Fa, the first filler via Fb, and the second filler via Fc will be explained more specifically below in the explanation of FIGS. 2 to 6.

Figure 2:
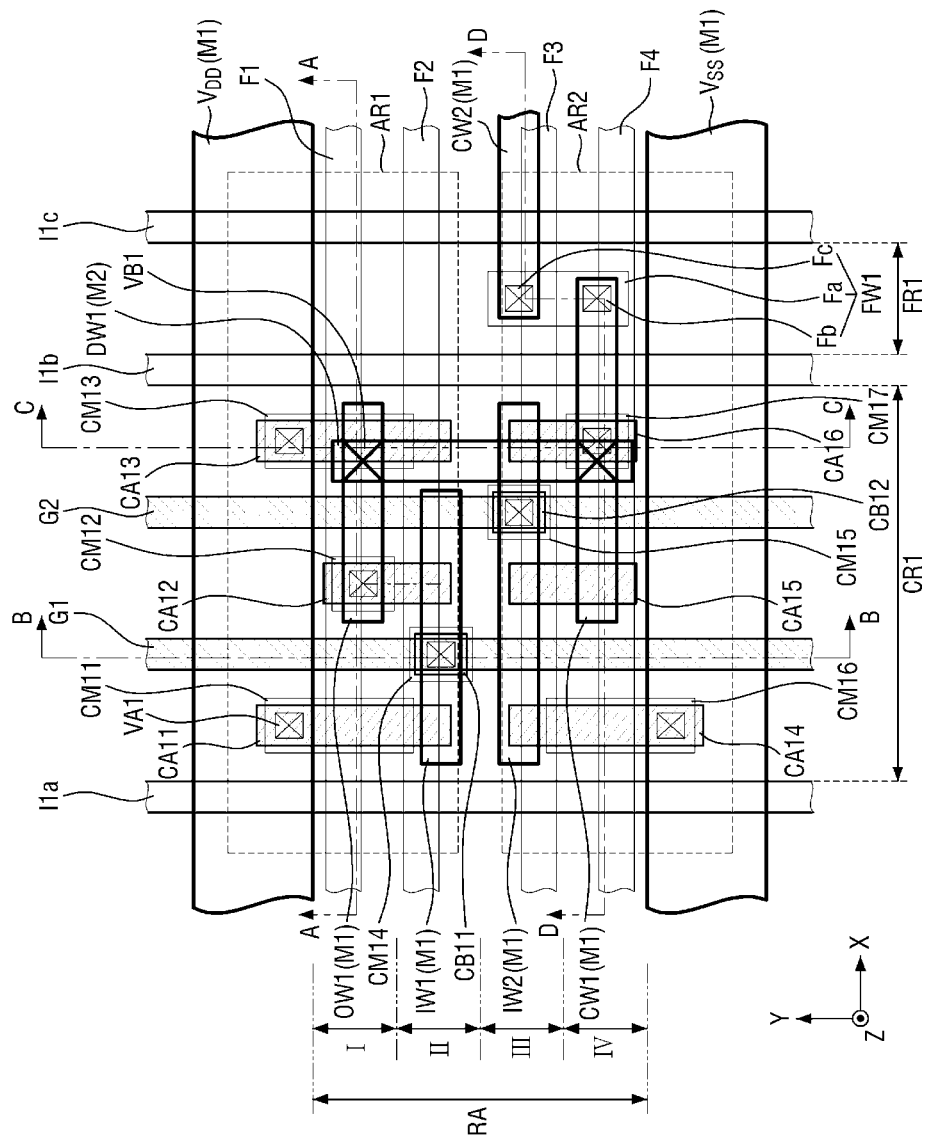
FIG. 2 is a plan view for explaining a semiconductor device according to some embodiments.
Figure 3:
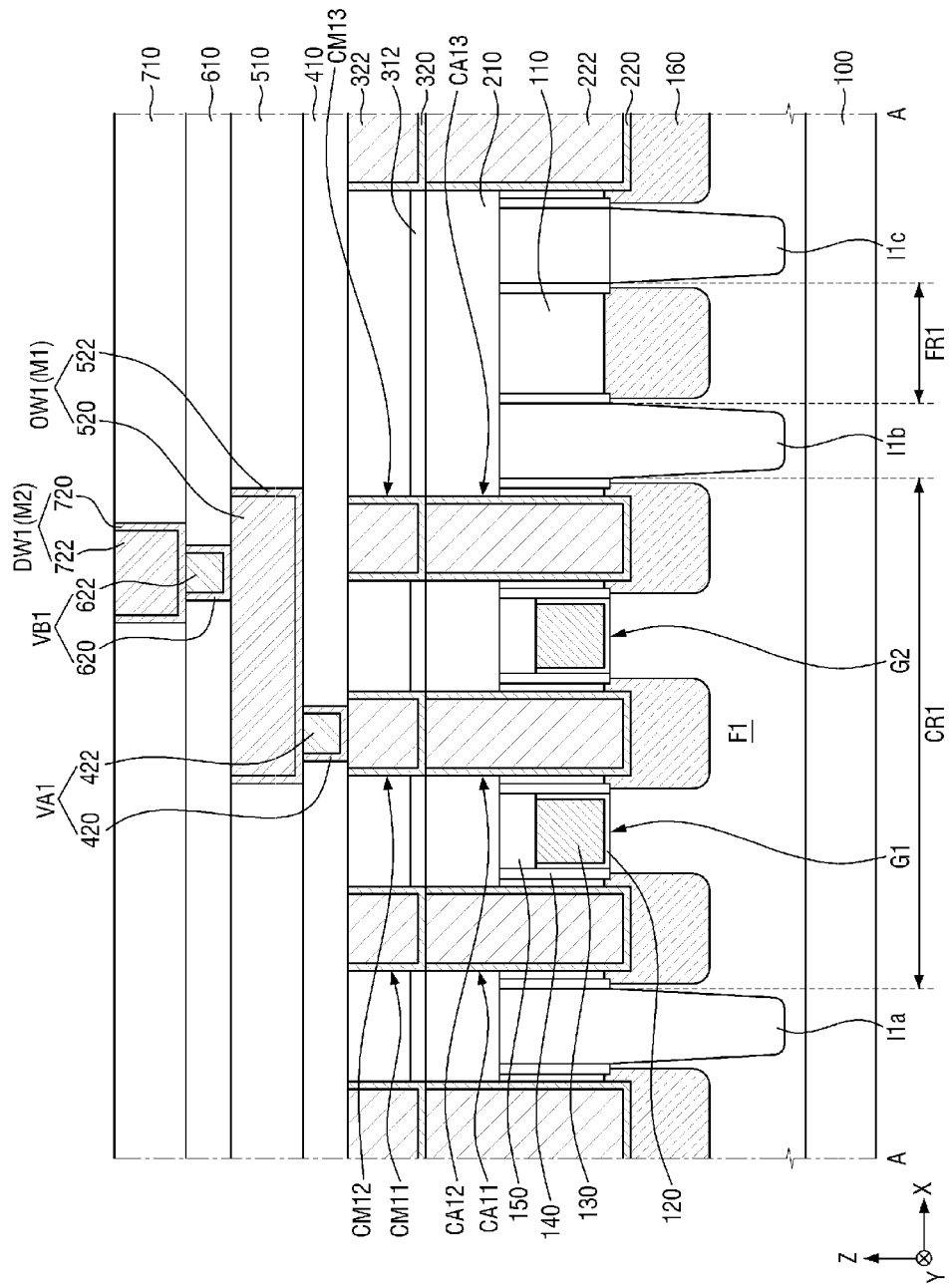
FIG. 3 is a cross-sectional view taken along a line A-A of FIG. 2.
Figure 4:
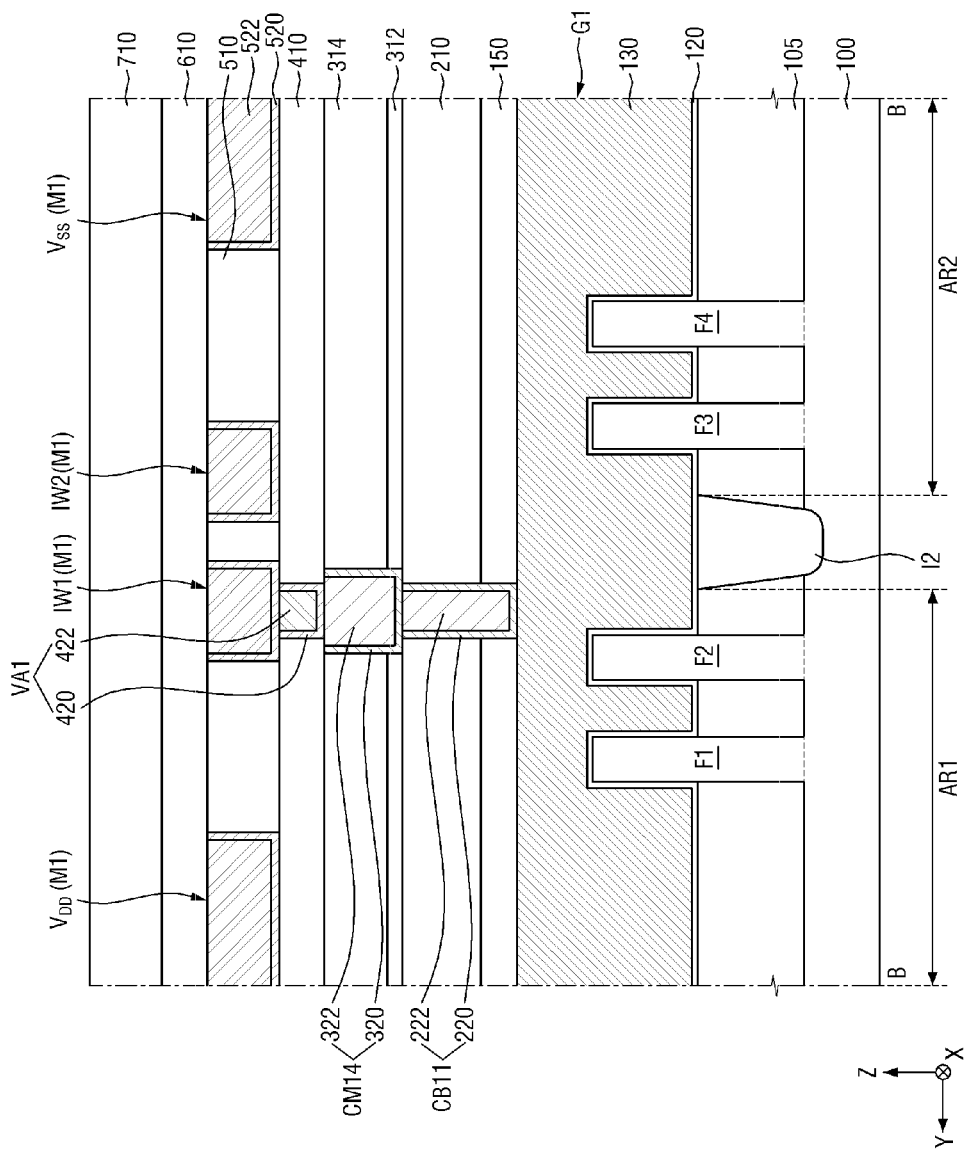
FIG. 4 is a cross-sectional view taken along a line B-B of FIG. 2.
Figure 5:
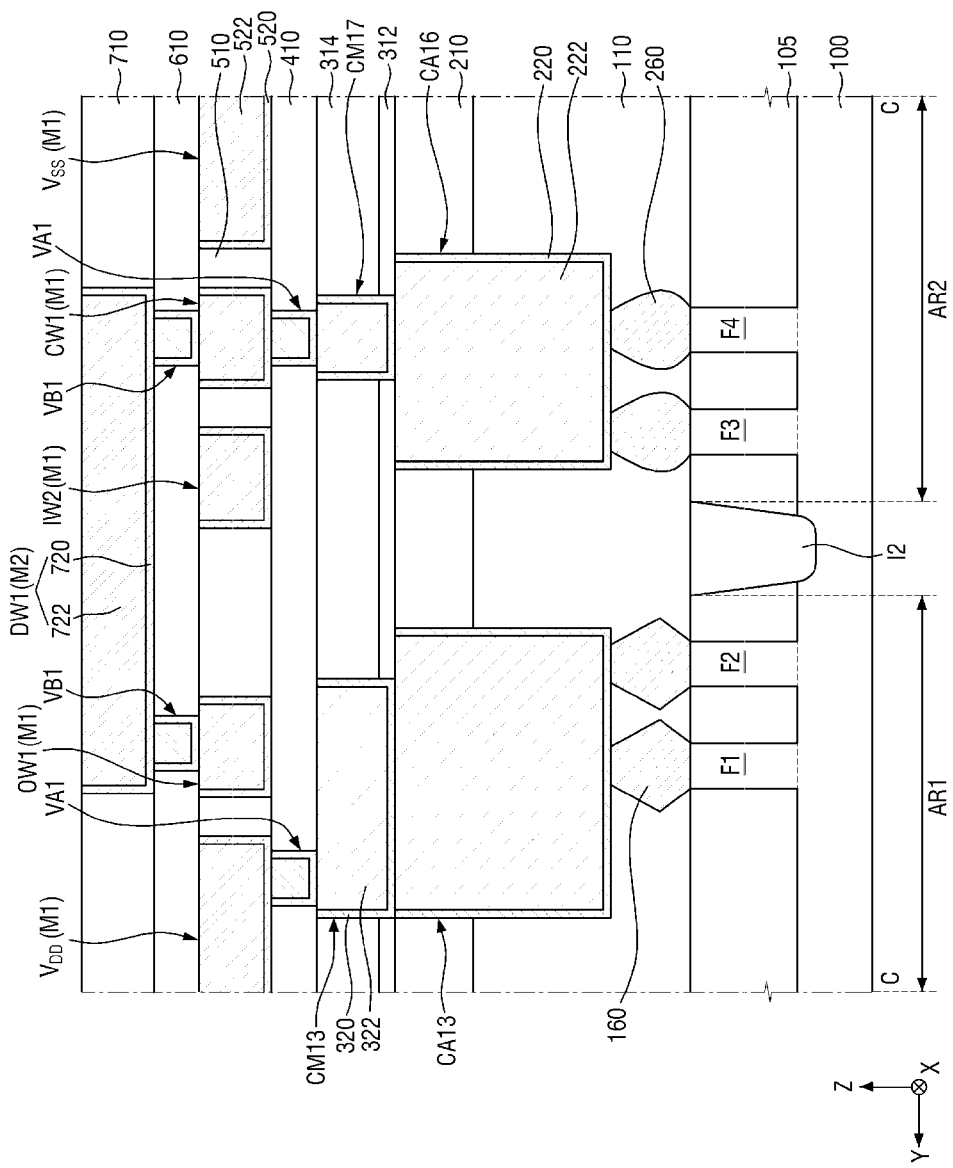
FIG. 5 is a cross-sectional view taken along a line C-C of FIG. 2.
Figure 6:
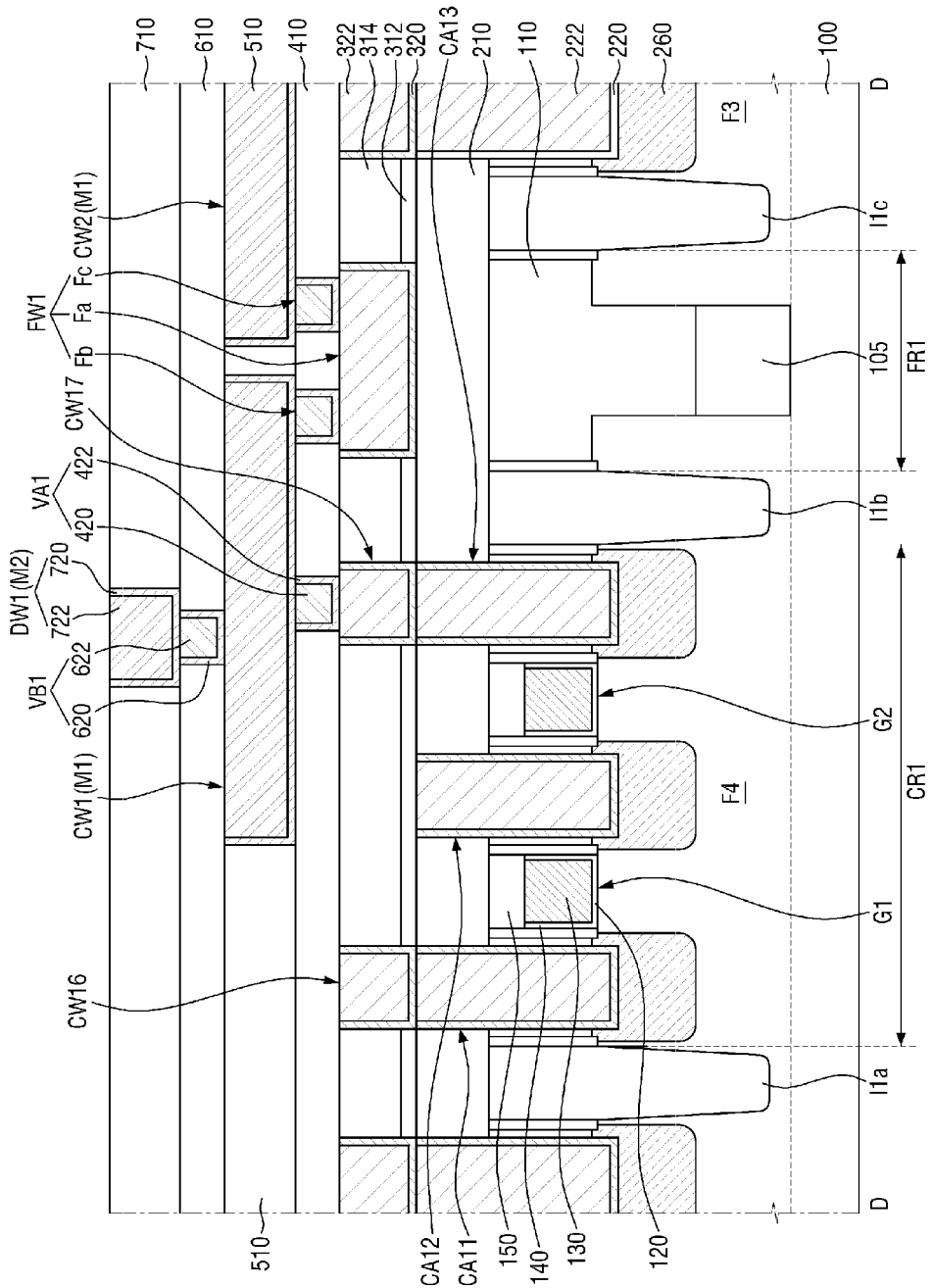
FIG. 6 is a cross-sectional view taken along a line D-D of FIG. 2.

FIG. 2 is a plan view for explaining a semiconductor device according to some embodiments. FIG. 3 is a cross-sectional view taken along a line A-A of FIG. 2. FIG. 4 is a cross-sectional view taken along a line B-B of FIG. 2. FIG. 5 is a cross-sectional view taken along a line C-C of FIG. 2. FIG. 6 is a cross-sectional view taken along a line D-D of FIG. 2.

The semiconductor device shown in FIGS. 2 to 6 may be an example of the semiconductor device which is implemented using the layout diagram of FIG. 1. For the sake of convenience of explanation, repeated parts of the contents explained above using FIG. 1 may be briefly explained or omitted.

Referring to FIGS. 2 to 6, the semiconductor device according to some embodiments may be formed on a substrate 100.

The substrate 100 may be bulk silicon or a SOI (silicon-on-insulator). Alternatively, the substrate 100 may be a silicon substrate or may include, but is not limited to, other material such as silicon germanium, SGOI (silicon germanium on insulator), indium antimonide, lead tellurium compound, indium arsenide, phosphide indium, gallium arsenide or gallium antimonide.

The substrate 100 may include a first active region AR1 and a second active region AR2. For convenience of explanation, explanation will be provided on the assumption that the first active region AR1 is a PFET region and the second active region AR2 is an NFET region.

In some embodiments, the first active region AR1 and the second active region AR2 may be separated by an element separation film I2. For example, as shown in FIGS. 4 and 5, the element separation film I2 may extend in the first direction X to separate the first active region AR1 and the second active region AR2.

A plurality of active patterns F1 to F4 may be formed on the substrate 100. For example, first and second active patterns F1 and F2 may be formed on the first active region AR1, and third and fourth active patterns F3 and F4 may be formed on the second active region AR2. In some embodiments, each of the active patterns F1 to F4 may include a fin-type pattern protruding from the upper surface of the substrate 100.

The first to fourth active patterns F1 to F4 may be spaced apart from each other and extend side by side. For example, each of the first to fourth active patterns F1 to F4 may extend in the first direction X. Also, the first to fourth active patterns F1 to F4 may be arranged side by side in the second direction Y. In some embodiments, the first to fourth active patterns F1 to F4 may be formed over both the first cell region CR1 and the first filler region FR1.

As shown in FIGS. 3 and 4, in some embodiments, the first to third cell separation films I1a, I1b, and I1c may cross the first to fourth active patterns F1 to F4. The first cell separation film I1a and the second cell separation film I1b may define a first cell region CR1 across the first to fourth active patterns F1 to F4. The second cell separation film I1b and the third cell separation film I1c may define the first filler region FR1 across the first to fourth active patterns F1 to F4.

A field insulating film 105 may be formed on the substrate 100. In some embodiments, the field insulating film 105 may surround some (e.g., lower portions) of side surfaces of the first to fourth active patterns F1 to F4. For example, as shown in FIGS. 4 to 6, some (e.g., upper portions of side surfaces) of the first to fourth active patterns F1 to F4 may protrude upward from the field insulating film 105.

The field insulating film 105 may include, for example, but is not limited thereto, at least one of silicon oxide ($SiO_2$), silicon nitride (SiN), silicon oxynitride (SiON), silicon oxycarbonitride (SiOCN) or a combination thereof.

The first gate electrode G1 and the second gate electrode G2 may both intersect each of the first to fourth active patterns F1 to F4. The first gate electrode G1 and the second gate electrode G2 may each include a gate conductive film 130. The gate conductive film 130 may include, for example, but is not limited to, at least one of titanium (Ti), tantalum (Ta), tungsten (W), aluminum (Al), cobalt (Co), and a combination thereof. The gate conductive film 130 may include, for example, silicon or silicon germanium other than metal.

Although the gate conductive film 130 is formed as a single film, the present disclosure is not limited thereto. Unlike the shown example, the gate conductive film 130 may be formed by stacking a plurality of conductive materials. For example, the gate conductive film 130 may include a work function adjusting film that adjusts a work function, and a filling conductive film that fills a space formed by the work function adjusting film. The work function adjusting film may include, for example, at least one of titanium nitride (TiN), tantalum nitride (TaN), titanium carbide (TiC), tantalum carbide (TaC), titanium aluminum carbide (TiAlC), and a combination thereof. The filling conductive film may include, for example, W or Al. The gate conductive film 130 may be formed through, for example, but is not limited to, a replacement process.

A gate dielectric film 120 may be interposed between the first to fourth active patterns F1 to F4 and the gate conductive film 130. For example, the gate dielectric film 120 may extend along the side wall and bottom surface of the gate conductive film 130. However, the present disclosure is not limited thereto, and the gate dielectric film 120 may extend only along the bottom surface of the gate conductive film 130.

In some embodiments, a part of the gate dielectric film 120 may be interposed between the field insulating film 105 and the gate conductive film 130. For example, as shown in FIG. 5, the gate dielectric film 120 may further extend along the upper surface of the field insulating film 105.

The gate dielectric film 120 may include, for example, at least one of silicon oxide, silicon oxynitride, silicon nitride, and a high-k material having a higher dielectric constant than silicon oxide. The high-k material may include, for example, but is not limited to, hafnium oxide.

A gate spacer 140 may be formed on the substrate 100 and the field insulating film 105. The gate spacer 140 may extend along both (e.g., opposite) sides of the gate conductive film 130. For example, the gate spacer 140 may extend in the second direction Y and intersect the first to fourth active patterns F1 to F4.

The gate spacer 140 may include, for example, but is not limited to, at least one of silicon oxide, silicon nitride, silicon oxynitride, and combinations thereof.

A gate capping pattern 150 may extend along the upper surface of the gate conductive film 130. For example, the gate capping pattern 150 may extend in the second direction Y to cover the upper surface of the gate conductive film 130.

A first source/drain region 160 may be formed on the first active region AR1. For example, the first source/drain regions 160 may be formed in the first and second active patterns F1 and F2 on both (e.g., opposite) sides of the gate conductive film 130. The first source/drain region 160 may be spaced apart from the gate conductive film 130 by the gate spacer 140.

A second source/drain region 260 may be formed on the second active region AR2. For example, the second source/drain region 260 may be formed in the third and fourth active patterns F3 and F4 on both (e.g., opposite) sides of the gate conductive film 130. The second source/drain region 260 may be spaced apart from the gate conductive film 130 by the gate spacer 140.

The first source/drain region 160 and the second source/drain region 260 may include epitaxial layers formed in each of the first to fourth active patterns F1 to F4.

When the semiconductor device formed in the first active region AR1 is a PFET, the first source/drain region 160 may include p-type impurities or impurities for impeding/preventing diffusion of p-type impurities. For example, the first source/drain region 160 may include at least one of boron (B), carbon (C), indium (In), gallium (Ga), and Al, or a combination thereof.

When the semiconductor device formed in the second active region AR2 is an NFET, the second source/drain region 260 may include n-type impurities or impurities for impeding/preventing diffusion of the n-type impurities. For example, the second source/drain region 260 may include at least one of phosphorus (P), antimony (Sb), arsenic (As), or a combination thereof.

Although the first source/drain region 160 and the second source/drain region 260 are each formed of a single film, the present disclosure is not limited thereto. For example, each of the first source/drain region 160 and the second source/drain region 260 may be formed of multi-films containing impurities of concentrations that are different from each other.

A plurality of interlayer insulating films 110, 210, 314, and 410 may be formed on the substrate 100. For example, first to seventh interlayer insulating films 110, 210, 314, 410, 510, 610, and 710 that are sequentially stacked may be formed on the substrate 100.

The first to seventh interlayer insulating films 110, 210, 314, 410, 510, 610, and 710 may include, for example, but are not limited to, at least one of silicon oxide, silicon nitride, silicon oxynitride, and a low-k material having a dielectric constant lower than that of silicon oxide.

In some embodiments, a liner film 312 may be further formed between the second interlayer insulating film 210 and the third interlayer insulating film 314. The liner film 312 may protect/prevent the second interlayer insulating film 210 from being damaged in the process of forming the connection contacts CM11 to CM17. The liner film 312 may include, for example, but is not limited to, at least one of silicon oxide, silicon nitride, silicon oxynitride, silicon carbide, silicon oxycarbonitride, aluminum nitride (AlN), or a combination thereof. Although the liner film 312 is shown as a single film, the present disclosure is not limited thereto. Unlike the shown example, the liner film 312 may be formed by stacking a plurality of insulating materials.

The first interlayer insulating film 110 and the second interlayer insulating film 210 may be formed on (e.g., to cover) the field insulating film 105, the first source/drain region 160, the second source/drain region 260, the gate spacer 140, and the gate capping pattern 150. For example, the first interlayer insulating film 110 may cover the upper surface of the field insulating film 105, the upper surface of the first source/drain region 160, the upper surface of the second source/drain region 260 and the side surface of the gate spacer 140. The second interlayer insulating film 210 may cover the upper surface of the gate capping pattern 150 and the upper surface of the first interlayer insulating film 110.

The source/drain contacts CA11 to CA16 penetrate the first interlayer insulating film 110 and the second interlayer insulating film 210, and may be connected to the first source/drain region 160 or the second source/drain region 260. For example, the first to third source/drain contacts CA11, CA12, and CA13 may be connected to the first source/drain region 160, and the fourth to sixth source/drain contacts CA14, CA15, and CA16 may be connected to the second source/drain region 260.

The gate contacts CB11 and CB12 penetrate the first interlayer insulating film 110 and the second interlayer insulating film 210, and may be connected to the gate conductive film 130. For example, a first gate contact CB11 may be connected to the gate conductive film 130 of the first gate electrode G1, and a second gate contact CB12 may be connected to the gate conductive film 130 of the second gate electrode G2.

In some embodiments, the upper surfaces of the source/drain contacts CA11 to CA16 and the upper surfaces of the gate contacts CB11 and CB12 may be coplanar. For example, as shown in FIGS. 3 to 6, the upper surfaces of the source/drain contacts CA11 to CA16 and the upper surfaces of the gate contacts CB11 and CB12 may be in the same plane as the upper surface of the second interlayer insulating film 210.

The connection contacts CM11 to CM17 penetrate the liner film 312 and the third interlayer insulating film 314, and may be connected to the source/drain contacts CA11 to CA16 or the gate contacts CB11 and CB12. For example, a first connection contact CM11 may be in contact with the upper surface of the first source/drain contact CA11. A second connection contact CM12 may be in contact with the upper surface of the second source/drain contact CA12. A third connection contact CM13 may be in contact with the upper surface of the third source/drain contact CA13. A fourth connection contact CM14 may be in contact with the upper surface of the first gate contact CB11. A fifth connection contact CM15 may be in contact with the upper surface of the second gate contact CB12. A sixth connection contact CM16 may be in contact with the upper surface of the fourth source/drain contact CA14. A seventh connection contact CM17 may be in contact with the upper surface of the sixth source/drain contact CA16.

The connection contacts CM11 to CM17 may be placed at the same level as each other. As used herein, the expression "placed at the same level" means that the connection contacts are formed at the same height relative to the upper surface of the substrate 100. For example, the upper surfaces of the connection contacts CM11 to CM17 may be placed on the same plane as the upper surface of the third interlayer insulating film 314.

Each of the first routing vias VA1 penetrates the fourth interlayer insulating film 410, and may be connected to some of the connection contacts CM11 to CM17. For example, the first routing vias VA1 may be connected to the upper surfaces of some of the connection contacts CM11 to CM17.

Each of the first routing wirings OW1, IW1, IW2, and CW1 may extend in the first direction X. The first routing wirings OW1, IW1, IW2, and CW1 may be placed at a higher level than the source/drain contacts CA11 to CA16, the gate contacts CB11 and CB12, and the connection contacts CM11 to CM17. For example, the upper surfaces of the first routing wirings OW1, IW1, IW2, and CW1 may be formed to be higher than the upper surfaces of the source/drain contacts CA11 to CA16, the upper surfaces of the gate contacts CB11 and CB12, and the upper surfaces of the connection contacts CM11 to CM17.

In some embodiments, the first routing wirings OW1, IW1, IW2, and CW1 are each connected to the upper surface of the first routing via VAL and may be connected to some of the connection contacts CM11 to CM17. For example, a first output wiring OW1 may be connected to a second connection contact CM12. A first input wiring IW1 may be connected to a fourth connection contact CM14. A second input wiring IW2 may be connected to a fifth connection contact CM15. A first connection wiring CW1 may be connected to a seventh connection contact CM17.

The first power supply wiring $V_{DD}$ and the second power supply wiring $V_{SS}$ may extend in the first direction X, respectively. The first power supply wiring $V_{DD}$ and the second power supply wiring $V_{SS}$ may be placed at higher levels than the source/drain contacts CA11 to CA16, the gate contacts CB11 and CB12, and the connection contacts CM11 to CM17. For example, the upper surface of the first power supply wiring $V_{DD}$ and the upper surface of the second power supply wiring $V_{SS}$ may be placed on the same plane as the upper surfaces of the first routing wirings OW1, IW1, IW2, and CW1.

In some embodiments, the first power supply wiring $V_{DD}$ and the second power supply wiring $V_{SS}$ are connected to the upper surface of the first routing via VAL and may be connected to some other parts of the connection contacts CM11 to CM17. For example, the first power supply wiring $V_{DD}$ may be connected to the first connection contact CM11. The second power supply wiring $V_{SS}$ may be connected to the sixth connection contact CM16.

The second routing vias VB1 penetrate the sixth interlayer insulating film 610 and may be connected to some of the first routing wirings OW1, IW1, IW2, and CW1. For example, the second routing vias VB1 may be connected to the upper surfaces of some of the first routing wirings OW1, IW1, IW2, and CW1, respectively.

The second routing wiring DW1 may extend in the second direction Y. The second routing wiring DW1 may be placed at a higher level than the first routing wirings OW1, IW1, IW2, and CW1. For example, the upper surface of the second routing wiring DW1 may be formed higher than the upper surfaces of the first routing wirings OW1, IW1, IW2, and CW1.

In some embodiments, each of the second routing wirings DW1 is connected to the upper surface of the second routing via VB1, and may be connected to some of the first routing wirings OW1, IW1, IW2, and CW1. For example, the second routing wiring DW1 may be connected to the first output wiring OW1 and the first connection wiring CW1.

The first filler wiring FW1 may be interposed between the second cell separation film I1b and the third cell separation film I1c. The first filler wiring FW1 may extend in the second direction Y to connect the first connection wiring CW1 and the second connection wiring CW2. The first filler wiring FW1 may be placed at a level lower than the first routing wirings OW1, IW1, IW2, and CW1. For example, the upper surface of the first filler wiring FW1 may be formed to be the same as or lower than the upper surfaces of the first routing wirings OW1, IW1, IW2, and CW1.

In some embodiments, the first filler wiring FW1 may include a filler contact Fa, a first filler via Fb and a second filler via Fc.

The filler contact Fa extends in the second direction Y and may be connected to the first connection wiring CW1 and the second connection wiring CW2. In some embodiments, the filler contact Fa may be placed at the same level as the connection contacts CM11 to CM17. For example, as shown in FIG. 6, the upper surface of the filler contact Fa may be placed on the same plane as the upper surface of the connection contacts CM11 to CM17.

The first filler via Fb may connect the first connection wiring CW1 and the first filler wiring FW1. For example, the first filler via Fb penetrates the fourth interlayer insulating film 410 and may be connected to the upper surface of the filler contact Fa, and the first connection wiring CW1 may be connected to the upper surface of the first filler via Fb.

The second filler via Fc may connect the first filler wiring FW1 and the second connection wiring CW2. For example, the second filler via Fc penetrates the fourth interlayer insulating film 410 and may be connected to the upper surface of the filler contact Fa, and the second connection wiring CW2 may be connected to the upper surface of the second filler via Fc.

In some embodiments, the first filler via Fb and the second filler via Fc may be placed at the same level as the first routing via VA1. For example, the upper surface of the first filler via Fb and the upper surface of the second filler via Fc may be placed on the same plane as the upper surfaces of the first routing vias VA1.

In some embodiments, the source/drain contacts CA11 to CA16 and the gate contacts CB11 and CB12 may each include a first barrier film 220 and a first filling film 222. The first barrier film 220 may extend along the upper surface of the first source/drain region 160, the upper surface of the second source/drain region 260, the side surface of the first interlayer insulating film 110, and the side surface of the second interlayer insulating film 210. The first filling film 222 may be in (e.g., may fill) a space formed by the first barrier film 220.

In some embodiments, the connection contacts CM11 to CM17 and the filler contact Fa may each include a second barrier film 320 and a second filling film 322. The second barrier film 320 may extend along the upper surfaces of the source/drain contacts CA11 to CA16, the upper surfaces of the gate contacts CB11 and CB12, the side surface of the liner film 312, and the side surface of the third interlayer insulating film 314. The second filling film 322 may be in (e.g., may fill) the space formed by the second barrier film 320.

In some embodiments, the first routing vias VA1, the first filler via Fb and the second filler via Fc may each include a third barrier film 420 and a third filling film 422. The third barrier film 420 may extend along the upper surfaces of the connection contacts CM11 to CM17 and the side surface of the fourth interlayer insulating film 410. The third filling film 422 may be in (e.g., may fill) the space formed by the third barrier film 420.

In some embodiments, the first routing wirings OW1, IW1, IW2, and CW1, the first power supply wiring $V_{DD}$ and the second power supply wiring $V_{SS}$ may each include a fourth barrier film 520 and a fourth filling film 522. The fourth barrier film 520 may extend along the upper surface of the first routing via VA1, the upper surface of the fourth interlayer insulating film 410 and the side surface of the fifth interlayer insulating film 510. The fourth filling film 522 may be in (e.g., may fill) the space formed by the fourth barrier film 520.

In some embodiments, the second routing vias VB1 may each include a fifth barrier film 620 and a fifth filling film 622. The fifth barrier film 620 may extend along the upper surfaces of the first routing wirings OW1, IW1, IW2, and CW1 and the side surfaces of the sixth interlayer insulating film 610. The fifth filling film 622 may be in (e.g., may fill) the space formed by the fifth barrier film 620.

In some embodiments, the second routing wiring DW1 may include a sixth barrier film 720 and a sixth filling film 722. The sixth barrier film 720 may extend along the upper surfaces of the first routing vias VA1, the upper surface of the sixth interlayer insulating film 610, and the side surface of the seventh interlayer insulating film 710. The sixth filling film 722 may be in (e.g., may fill) the space formed by the sixth barrier film 720.

The first to sixth barrier films 220, 320, 420, 520, 620, and 720 may include metal or a metal nitride for impeding/preventing diffusion of the first to sixth filling films 222, 322, 422, 522, 622, and 722, respectively. For example, the first to sixth barrier films 220, 320, 420, 520, 620, and 720 may include, but are not limited to, at least one of titanium (Ti), tantalum (Ta), tungsten (W), nickel (Ni), cobalt (Co), platinum (Pt), alloys thereof and nitrides thereof.

The first to sixth filling films 222, 322, 422, 522, 622, and 722, may include, but are not limited to, at least one of aluminum (Al), copper (Cu), tungsten (W), molybdenum (Mo), cobalt (Co) and alloys thereof.

The first routing vias VA1, the first routing wirings OW1, IW1, IW2, and CW1, the first power supply wiring $V_{DD}$, the second power supply wiring $V_{SS}$, the second routing vias VB1, and the second routing wiring DW1 may be formed by, for example, but are not limited to being formed by, a single damascene process. For example, the first routing vias VA1, the first routing wirings OW1, IW1, IW2, and CW1, the first power supply wiring $V_{DD}$, the second power supply wiring $V_{SS}$, the second routing vias VB1 and the second routing wiring DW1 may, in some embodiments, be formed by, for example, a dual damascene process or another wiring process.

Figure 7:
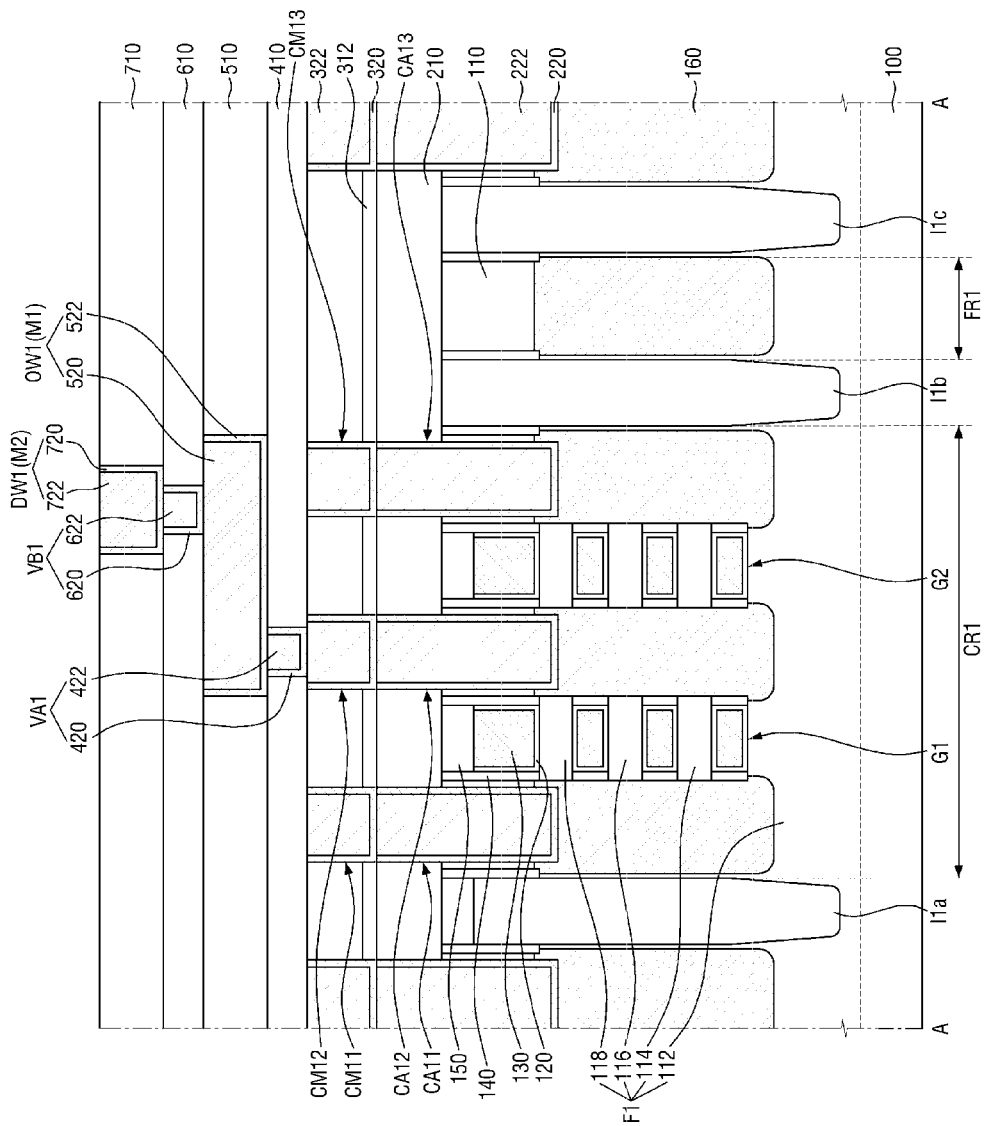
FIGS. 7 and 8 are cross-sectional views for explaining a semiconductor device according to some embodiments.
Figure 8:
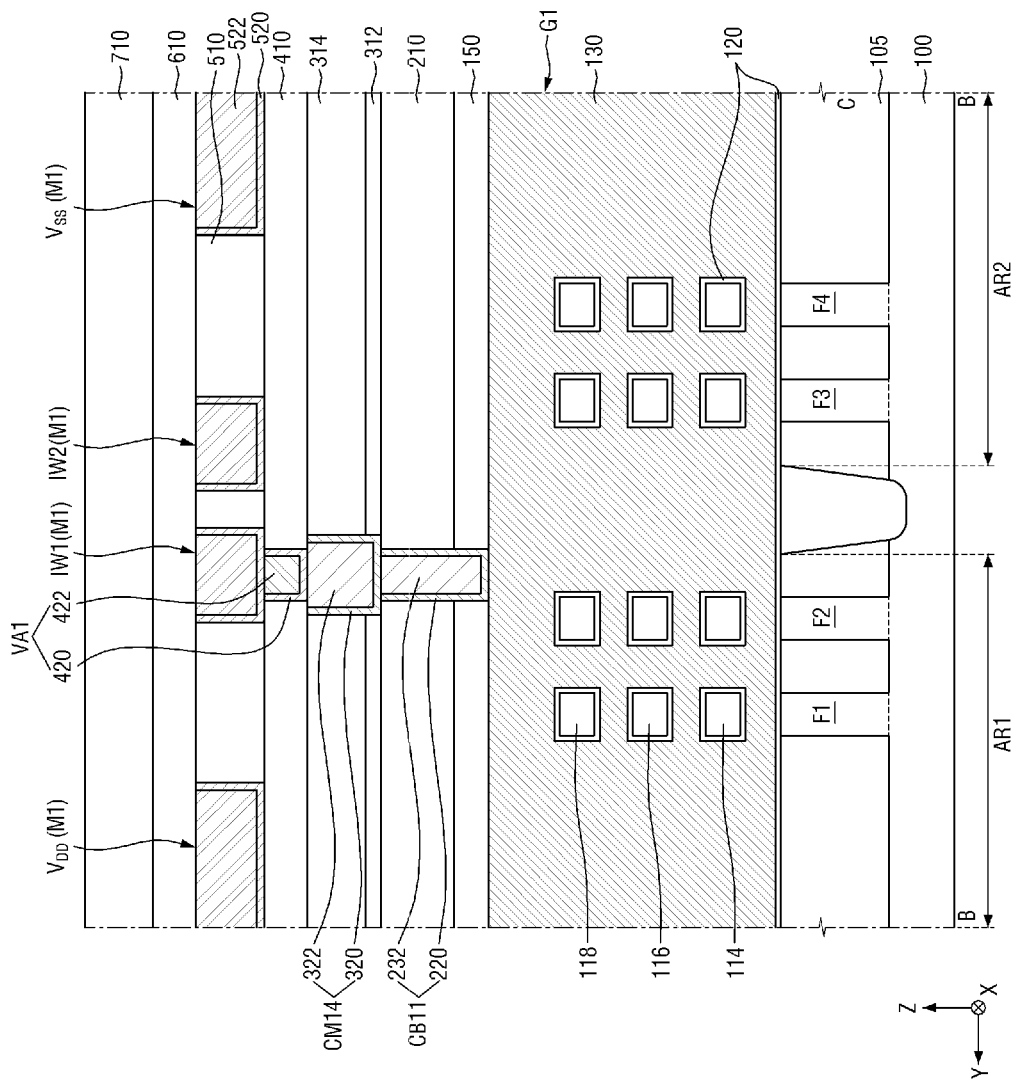

FIGS. 7 and 8 are cross-sectional views for explaining a semiconductor device according to some embodiments. For the sake of convenience of explanation, repeated parts of the contents explained above using FIGS. 1 to 6 may be briefly explained or omitted. For reference, FIG. 7 is a cross-sectional view taken along a line A-A of FIG. 2, and FIG. 8 is a cross-sectional view taken along a line B-B of FIG. 2.

Referring to FIGS. 7 and 8, in the semiconductor device according to some embodiments, each of the first to fourth active patterns F1 to F4 includes a plurality of wire patterns 114, 116, and 118.

For example, the first to fourth active patterns F1 to F4 may include first to third wire patterns 114, 116, and 118 that are sequentially stacked on the substrate 100 and are spaced apart from each other. For example, the first wire pattern 114 may be spaced apart from the substrate 100 in the third direction Z, the second wire pattern 116 may be spaced apart from the first wire pattern 114 in the third direction Z, and the third wire pattern 118 may be spaced apart from the second wire pattern 116 in the third direction Z.

Each of the first to third wire patterns 114, 116, and 118 may extend in the first direction X. Also, each of the first to third wire patterns 114, 116, and 118 may penetrate the first gate electrode G1 and the second gate electrode G2. Accordingly, as shown in FIG. 8, the first gate electrode G1 and the second gate electrode G2 may surround the outer peripheral surfaces of the first to third wire patterns 114, 116, and 118.

In FIG. 8, although each of the cross sections of the first to third wire patterns 114, 116, and 118 is shown as a rectangular shape, this is merely an example. For example, each of the cross-sections of the first to third wire patterns 114, 116, and 118 may be another polygonal shape or a circular shape.

In some embodiments, each of the first to fourth active patterns F1 to F4 may further include a fin-type pattern 112 protruding from the upper surface of the substrate 100 and extending in the first direction X. The first wire pattern 114 may be placed, for example, on the fin-type pattern 112.

Figure 9:
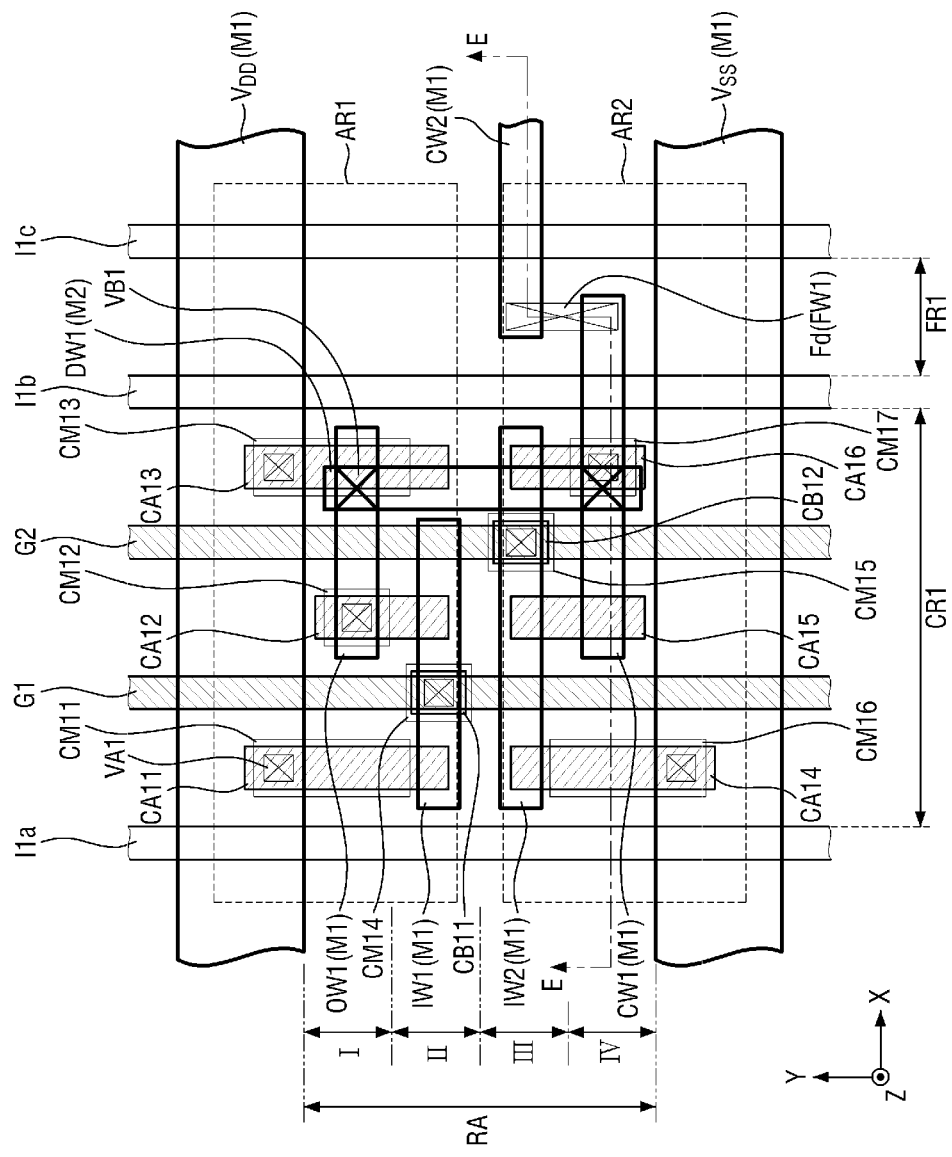
FIG. 9 is a layout diagram for explaining a semiconductor device according to some embodiments.
Figure 10:
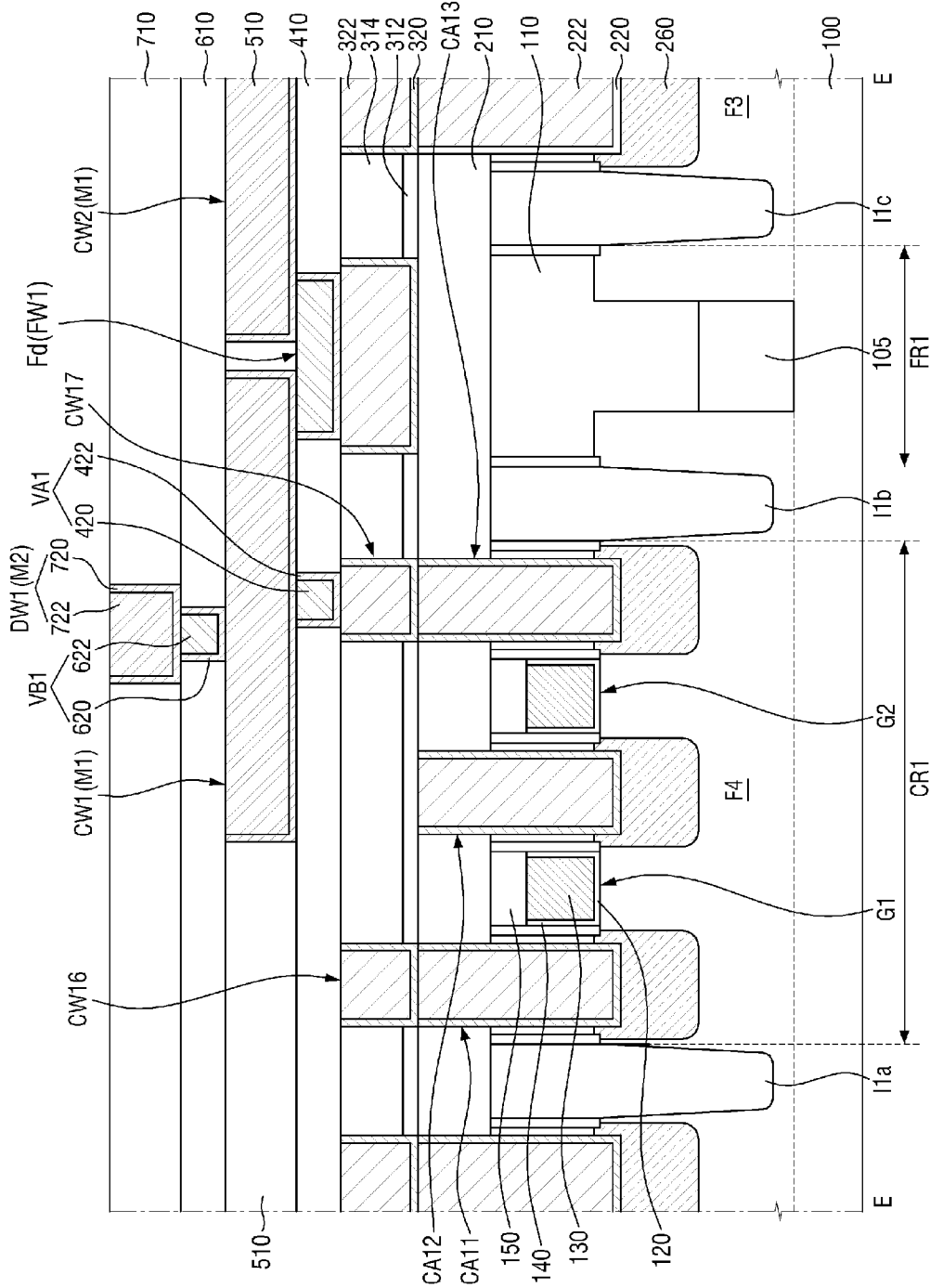
FIG. 10 is a cross-sectional view taken along a line E-E of FIG. 9.

FIG. 9 is a layout diagram for explaining a semiconductor device according to some embodiments. FIG. 10 is a cross-sectional view taken along a line E-E of FIG. 9. For convenience of explanation, repeated parts of the contents explained above using FIGS. 1 to 8 may be briefly explained or omitted.

Referring to FIGS. 9 and 10, in the semiconductor device according to some embodiments, the first filler wiring FW1 includes a third filler via Fd.

The third filler via Fd extends in the second direction Y and may be connected to the first connection wiring CW1 and the second connection wiring CW2. For example, the third filler via Fd may be connected to a lower surface of the first connection wiring CW1 and a lower surface of the second connection wiring CW2.

In some embodiments, the third filler via Fd may be placed at the same level as the first routing via VA1. For example, the upper surface of the third filler via Fd may be placed on the same plane as the upper surfaces of the first routing vias VA1. In some embodiments, the third filler via Fd may include a third barrier film 420 and a third filling film 422.

Figure 11:
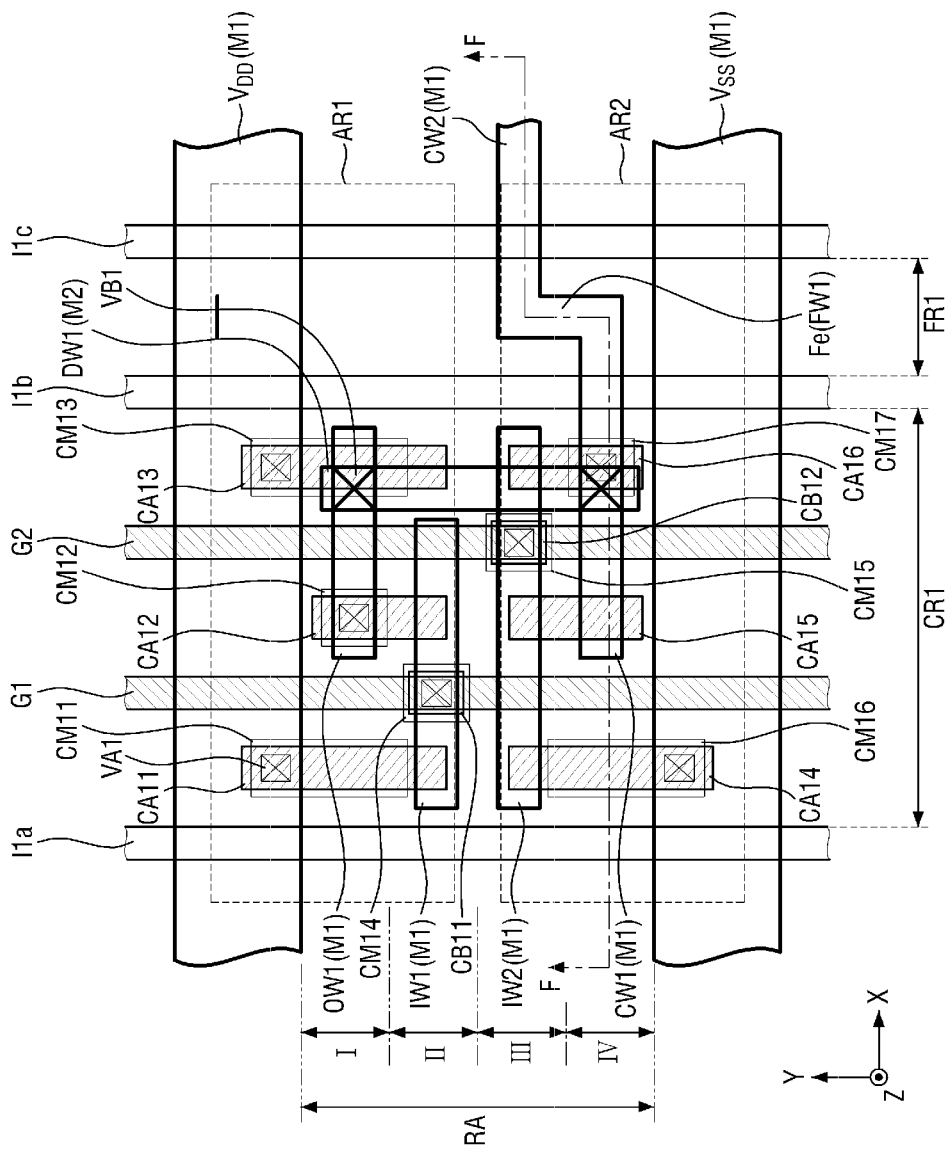
FIG. 11 is a layout diagram for explaining a semiconductor device according to some embodiments.
Figure 12:
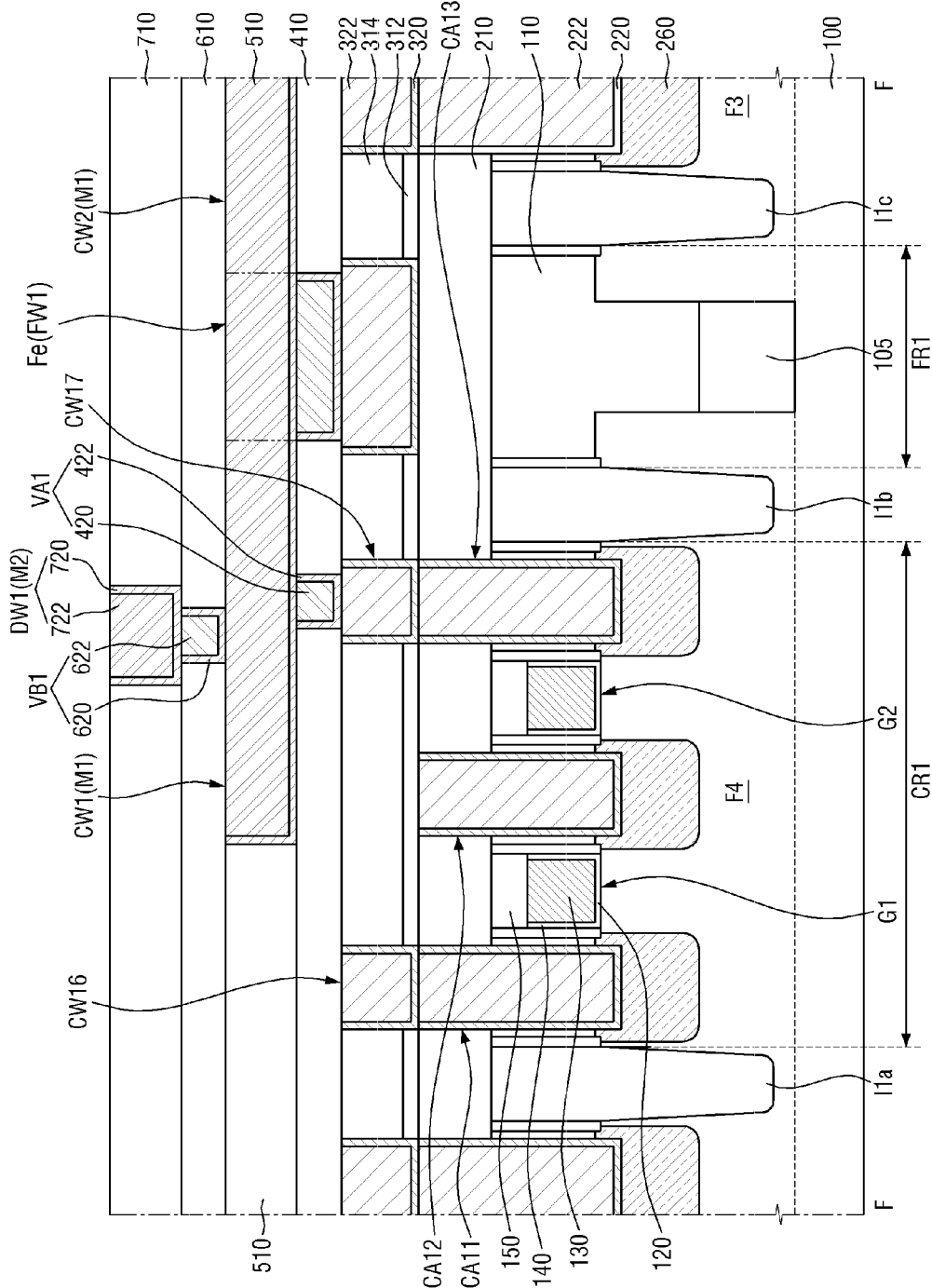
FIG. 12 is a cross-sectional view taken along a line F-F of FIG. 11.

FIG. 11 is a layout diagram for explaining a semiconductor device according to some embodiments. FIG. 12 is a cross-sectional view taken along a line F-F of FIG. 11. For the sake of convenience of explanation, repeated parts of the contents explained above using FIGS. 1 to 10 may be briefly explained or omitted.

Referring to FIGS. 9 and 10, in the semiconductor device according to some embodiments, the first filler wiring FW1 includes a filler routing wiring Fe.

The filler routing wiring Fe extends in the second direction Y and may be connected to the first connection wiring CW1 and the second connection wiring CW2. For example, the filler routing wiring Fe may be connected to the side surface of the first connection wiring CW1 and the side surface of the second connection wiring CW2.

In some embodiments, the filler routing wiring Fe may be placed at the same level as the first routing wirings OW1, IW1, IW2, and CW1. For example, the upper surface of the filler routing wiring Fe may be placed on the same plane as the upper surfaces of the first routing wirings OW1, IW1, IW2, and CW1. In some embodiments, the filler routing wiring Fe may include a fourth barrier film 520 and a fourth filling film 522. In some embodiments, the filler routing wiring Fe may be integrally formed with the first connection wiring CW1 and the second connection wiring CW2.

Hereinafter, the function of the first filler wiring FW1 of the semiconductor device according to some embodiments will be described with reference to FIGS. 1 to 13.

Figure 13:
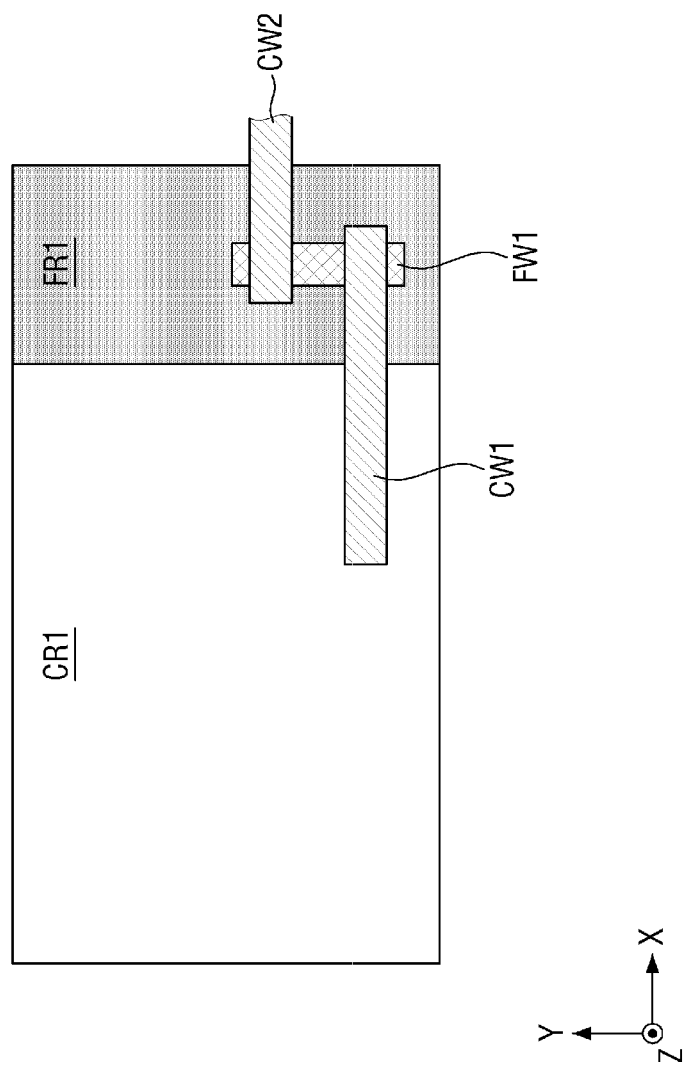
FIG. 13 is an example layout diagram for explaining the function of the filler wiring of the semiconductor device according to some embodiments.

FIG. 13 is an example layout diagram for explaining the function of the filler wiring of the semiconductor device according to some embodiments. For convenience of explanation, repeated parts of the contents explained above using FIGS. 1 to 12 may be briefly explained or omitted.

Referring to FIG. 13, the routing wiring (for example, the first connection wiring CW1) of the first cell region CR1 may be routed to another cell region through the first filler wiring FW1.

For example, the first connection wiring CW1 may be connected to the routing wiring (for example, the second connection wiring CW2) of another cell region through the first filler wiring FW1. As a result, the first cell region CR1 provides an output signal to another cell region through the first filler wiring FW1 and the second connection wiring CW2, or may receive an input signal from the another cell region.

As the structures inside the semiconductor device become more and more complicated and highly integrated, the use of high level wiring for routing of the semiconductor device is increasing. However, the excessive use of the high level wiring may cause a power loss and a PnR resource loss, which become a cause of degradation in the performance and productivity of the semiconductor device.

However, the semiconductor device according to some embodiments may reduce the use of the high level wiring, using the first filler wiring FW1. As explained above, since the first filler wiring FW1 may be formed in the first filler region FR1, which is a dummy cell region that fills the empty space between the cell regions, no additional space for routing the semiconductor device is needed. Also, as explained above, since the first filler wiring FW1 may be placed at a level lower than the first routing level M1, it is possible to route the signal of the first cell region CR1 without the use of an additional high level wiring (for example, the second routing wiring DW1 placed at the second routing level M2). This makes it possible to provide a semiconductor device with reduced power loss and PnR resource loss.

Hereinafter, semiconductor devices according to some embodiments will be described with reference to FIGS. 1 to 27.

FIGS. 14 to 17 are various layout diagrams for explaining a semiconductor device according to some embodiments. FIG. 18 is an example layout diagram for explaining the function of the filler wiring of the semiconductor device according to some embodiments. For the sake of convenience of explanation, repeated parts of the contents explained above using FIGS. 1 to 13 may be briefly explained or omitted.

Referring to FIGS. 14 to 17, the semiconductor device according to some embodiments further includes a second cell region CR2.

A standard cell provided by the cell library may be provided in the second cell region CR2. In FIGS. 14 to 17, the standard cell to be provided to the second cell region CR2 may be a NAND cell. However, this is merely an example, and it is needless to say that the standard cell provided in the second cell region CR2 may be various cells, for example, a NOR cell or an XOR cell.

The first filler region FR1 may be interposed between the first cell region CR1 and the second cell region CR2. For example, the first cell region CR1, the first filler region FR1 and the second cell region CR2 may be arranged sequentially along the first direction X.

In some embodiments, the second cell region CR2 may be defined by the third cell separation film I1c and the fourth cell separation film I1d arranged along the first direction X. For example, the third cell separation film I1c and the fourth cell separation film I1d may extend side by side in the second direction Y. The second cell region CR2 may be defined between the third cell separation film I1c and the fourth cell separation film I1d. The third cell separation film I1c may separate the first filler region FR1 and the second cell region CR2.

The semiconductor device according to some embodiments may include a third gate electrode G3, a fourth gate electrode G4, seventh to twelfth source/drain contacts CA21 to CA26, third and fourth gate contacts CB21 and CB22, eighth to fifteenth connection contacts CM21 to CM27, a second output wiring OW2, a third output wiring OW3, a third input wiring IW3, and a third routing wiring DW2.

The third gate electrode G3 and the fourth gate electrode G4 may be placed in the second cell region CR2. For example, the third gate electrode G3 and the fourth gate electrode G4 may be interposed between the third cell separation film I1c and the fourth cell separation film I1d.

The seventh to twelfth source/drain contacts CA21 to CA26 may be placed on both (e.g., opposite) sides of the third gate electrode G3 or the fourth gate electrode G4. The seventh to twelfth source/drain contacts CA21 to CA26 may be connected to the source/drain regions of the first active region AR1 or the second active region AR2. Since the arrangement of the seventh to twelfth source/drain contacts CA21 to CA26 may be similar to the arrangement of the first to sixth source/drain contacts CA11 to CA16, detailed explanation thereof will not be provided below.

The third and fourth gate contacts CB21 and CB22 may be placed to overlap the third gate electrode G3 or the fourth gate electrode G4. For example, the third gate contact CB21 may be connected to overlap the third gate electrode G3, and the fourth gate contact CB22 may be connected to overlap the fourth gate electrode G4. Since the arrangement of the third and fourth gate contacts CB21 and CB22 may be similar to the arrangement of the first and second gate contacts CB11 and CB12, detailed explanation thereof will not be provided below.

The eighth to fourteenth connection contacts CM21 to CM27 may be connected to some of the seventh to twelfth source/drain contacts CA21 to CA26 or some of the third and fourth gate contacts CB21 and CB22, respectively. Since the arrangement of the eighth to fourteenth connection contacts CM21 to CM27 may be similar to the arrangement of the first to seventh connection contacts CM11 to CM17, detailed explanation thereof will not be provided below.

The second output wiring OW2 may be placed in the first routing region I to overlap the ninth connection contact CM22. Also, a first routing via VA1 which connects the ninth connection contact CM22 and the second output wiring OW2 may be formed. Accordingly, the eighth source/drain contact CA22 may be connected to the second output wiring OW2.

The third input wiring IW3 may be placed in the second routing region II to overlap the eleventh connection contact CM24. Also, a first routing via VA2 which connects the eleventh connection contact CM24 and the third input wiring IW3 may be formed. Therefore, the third gate contact CB21 may be connected to the third input wiring IW3. The third input wiring IW3 may function as an input wiring that provides the first input signal to the second cell region CR2.

The second connection wiring CW2 may be placed in the third routing region III to overlap the twelfth connection contact CM25. Also, a first routing via VA2 that connects the twelfth connection contact CM25 and the second connection wiring CW2 may be formed. Accordingly, the fourth gate contact CB22 may be connected to the second connection wiring CW2. The second connection wiring CW2 may function as an input wiring that provides a second input signal to the second cell region CR2.

The third output wiring OW3 may be placed in the fourth routing region IV to overlap the fourteenth connection contact CM27. Also, a first routing via VA2 which connects the fourteenth connection contact CM27 and the third output wiring OW3 may be formed. Therefore, the twelfth source/drain contact CA26 may be connected to the third output wiring OW3.

The third input wiring IW3, the second connection wiring CW2, the second output wiring OW2 and the third output wiring OW3 may be formed at the BEOL process step. The third input wiring IW3, the second connection wiring CW2, the second output wiring OW2 and the third output wiring OW3 may be formed at the same routing level. For example, the third input wiring IW3, the second connection wiring CW2, the second output wiring OW2 and the third output wiring OW3 may be placed at the first routing level M1.

The third routing wiring DW2 may extend in the second direction Y to overlap the second output wiring OW2 and the third output wiring OW3. Also, a second routing via VB2 which connects the second output wiring OW2 and the third routing wiring DW2, and a second routing via VB2 which connects the third output wiring OW3 and the third routing wiring DW2 may be formed. Accordingly, the eighth source/drain contact CA22 may be connected to the twelfth source/drain contact CA26.

The third routing wiring DW2 may be formed at the BEOL process step. The third routing wirings DW2 may be formed at a level higher than the third input wiring IW3, the second connection wiring CW2, the second output wiring OW2 and the third output wiring OW3. For example, the third routing wirings DW2 may be placed at the second routing level M2.

The first filler wiring FW1 may connect the first connection wiring CW1 and the second connection wiring CW2. This enables the output signal of the first cell region CR1 to be provided as the second input signal of the second cell region CR2.

Figure 14:
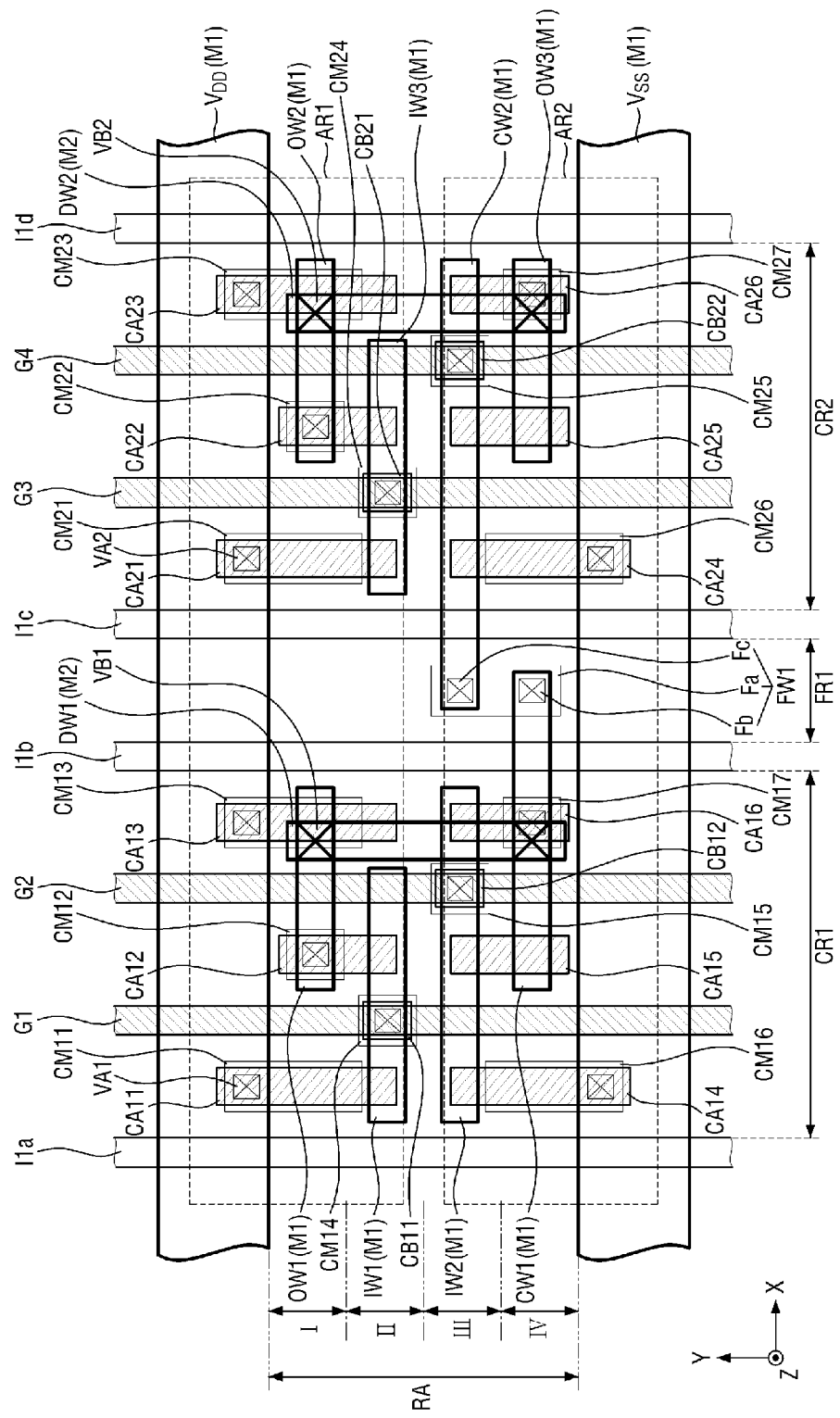
FIGS. 14 to 17 are various layout diagrams for explaining a semiconductor device according to some embodiments.

Referring to FIG. 14, in the semiconductor device according to some embodiments, the first filler wiring FW1 may include the filler contact Fa, the first filler via Fb, and the second filler via Fc explained above in the description of FIGS. 1 to 6.

Figure 15:
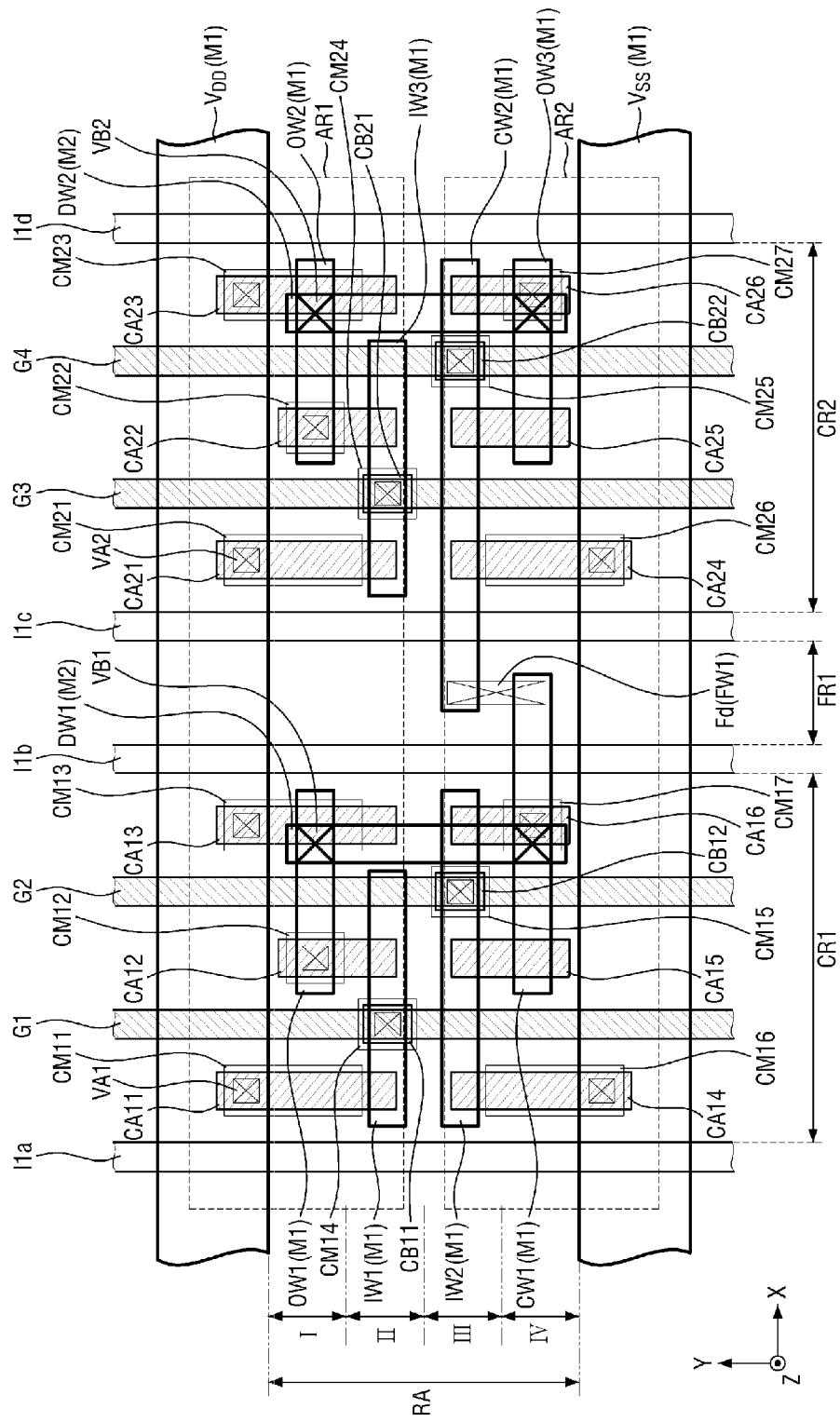

Referring to FIG. 15, in the semiconductor device according to some embodiments, the first filler wiring FW1 may include the third filler via Fd explained above in the description of FIGS. 9 and 10.

Figure 16:
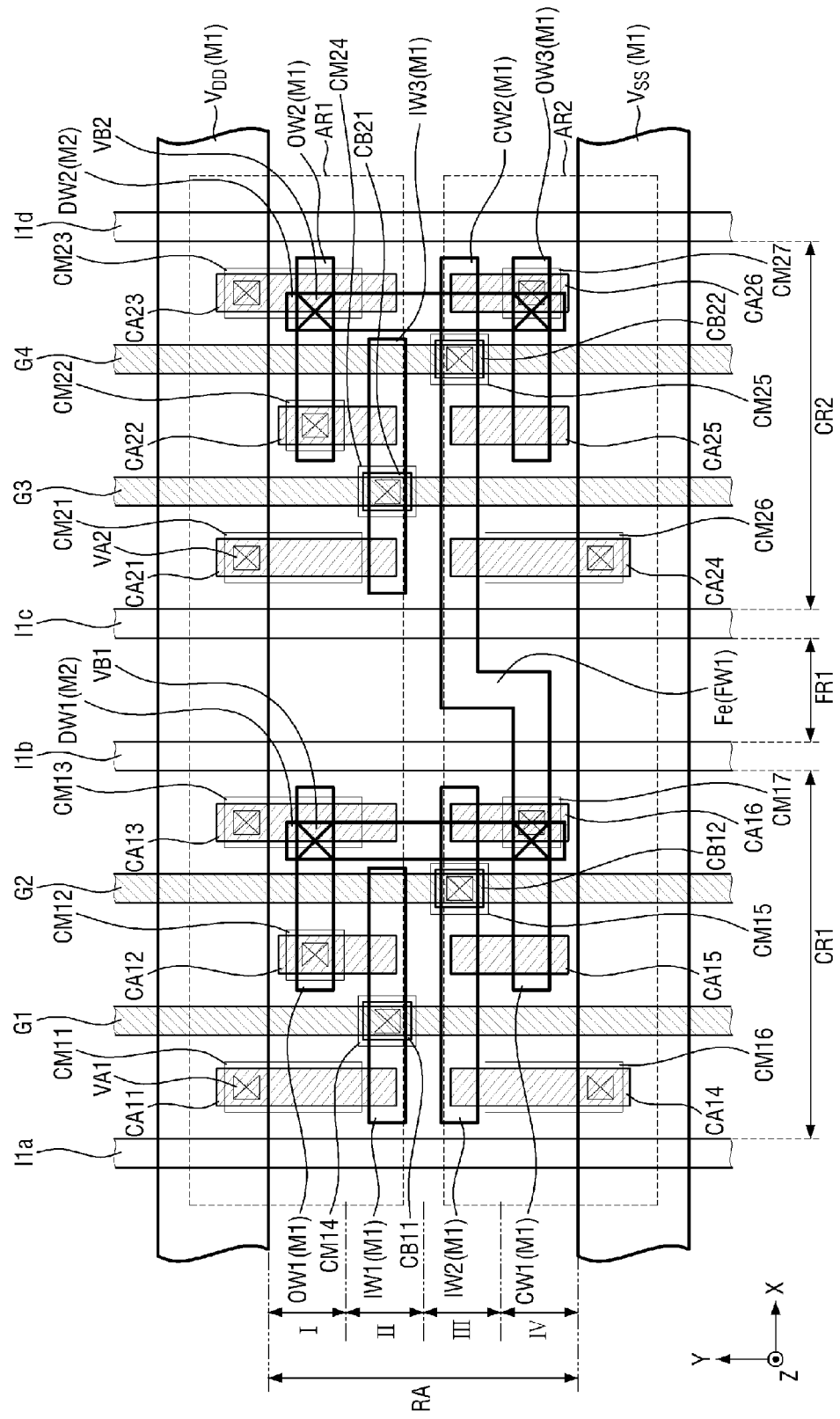

Referring to FIG. 16, in the semiconductor device according to some embodiments, the first filler wiring FW1 may include the filler routing wiring Fe explained above in the description of FIGS. 11 and 12.

Figure 17:
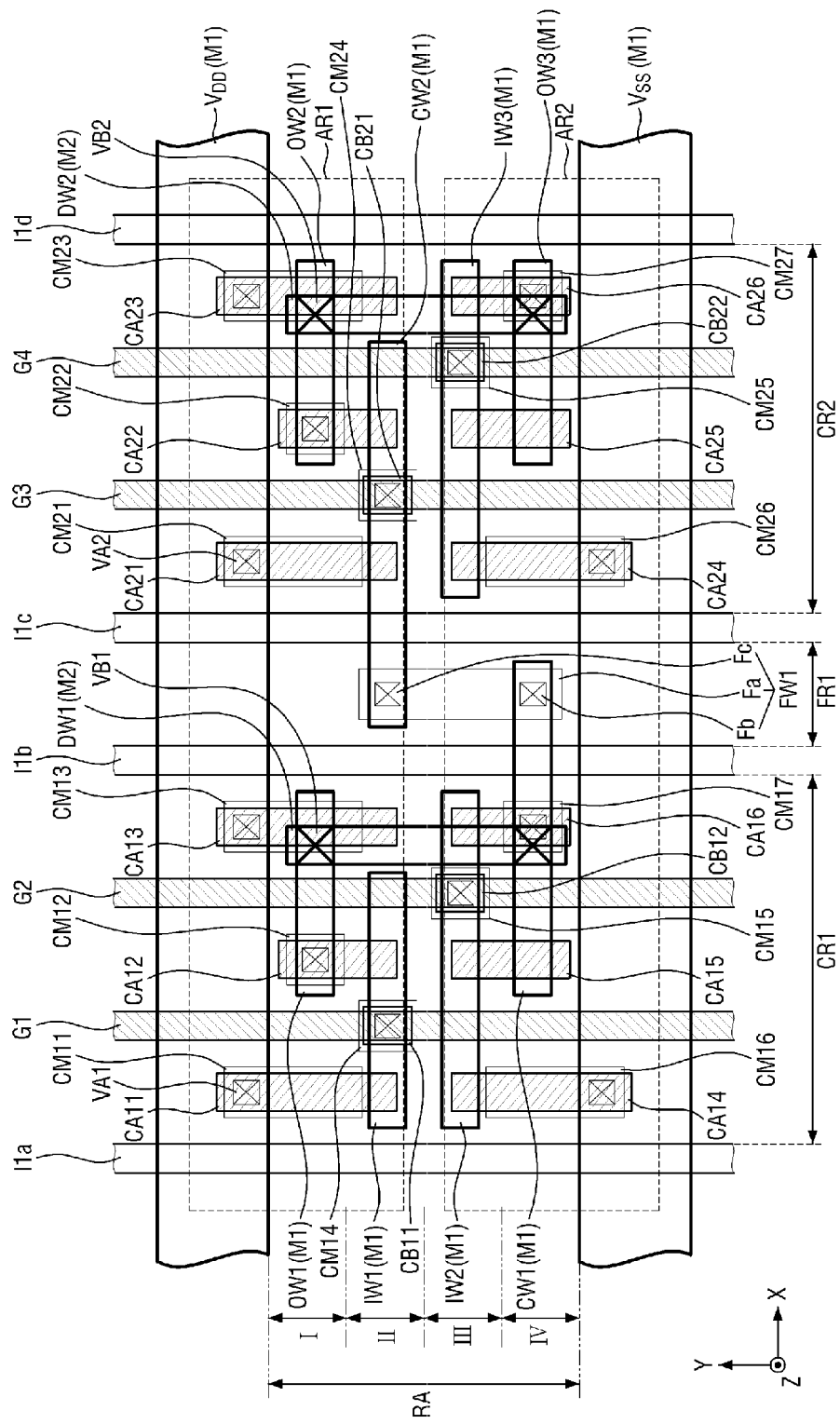
Figure 18:
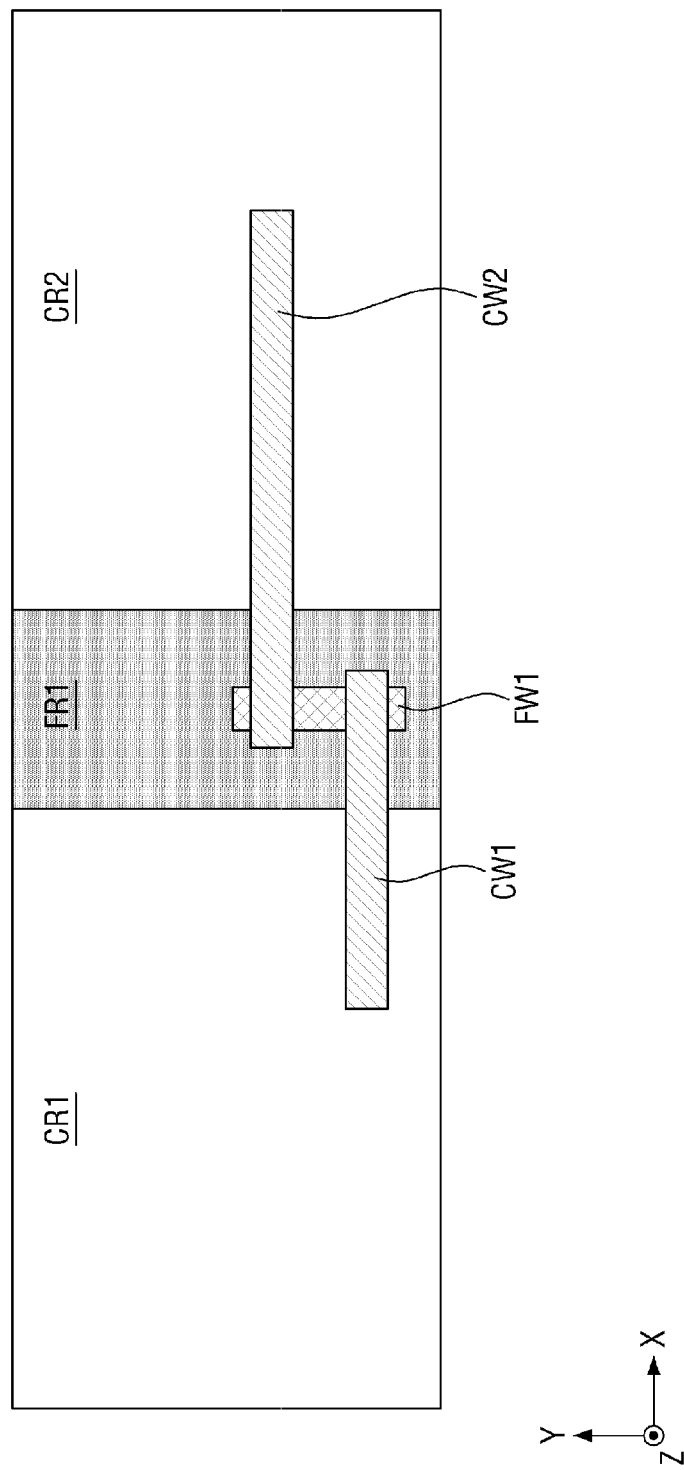
FIG. 18 is an example layout diagram for explaining the function of the filler wiring of the semiconductor device according to some embodiments.

Referring to FIG. 17, in the semiconductor device according to some embodiments, the second connection wiring CW2 may be placed in the second routing region II.

For example, the second connection wiring CW2 may be placed in the second routing region II to overlap the eleventh connection contact CM24. Also, a first routing via VA2 that connects the eleventh connection contact CM24 and the second connection wiring CW2 may be formed. Accordingly, the third gate contact CB21 may be connected to the second connection wiring CW2.

In some embodiments, the third input wiring IW3 may be placed in the third routing region III to overlap the twelfth connection contact CM25. Also, a first routing via VA2 which connects the twelfth connection contact CM25 and the third input wiring IW3 may be formed. Accordingly, the fourth gate contact CB22 may be connected to the third input wiring IW3.

In some embodiments, the first filler wiring FW1 may extend in the second direction Y over the second to fourth routing regions II to IV. Accordingly, the first filler wiring FW1 may be connected to the second connection wiring CW2 in the second routing region II.

Referring to FIG. 18, the routing wiring (for example, the first connection wiring CW1) of the first cell region CR1 may be routed to the second cell region CR2 through the first filler wiring FW1.

For example, the first connection wiring CW1 may be connected to the routing wiring (for example, the second connection wiring CW2) of the second cell region CR2 through the first filler wiring FW1. Accordingly, the first cell region CR1 may provide an output signal to the second cell region CR2 through the first filler wiring FW1 and the second connection wiring CW2, or may receive an input signal from the second cell region CR2.

Figure 19:
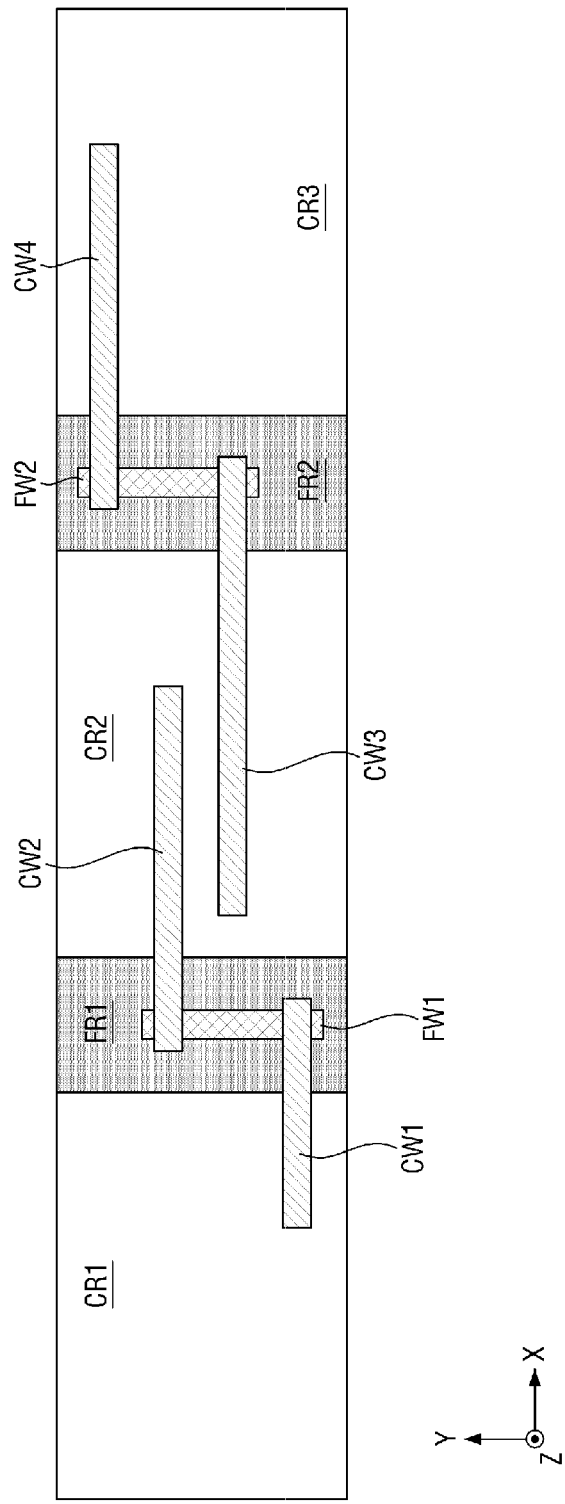
FIGS. 19 to 21 are various example layout diagrams for explaining the function of the filler wiring of the semiconductor device according to some embodiments.
Figure 20:
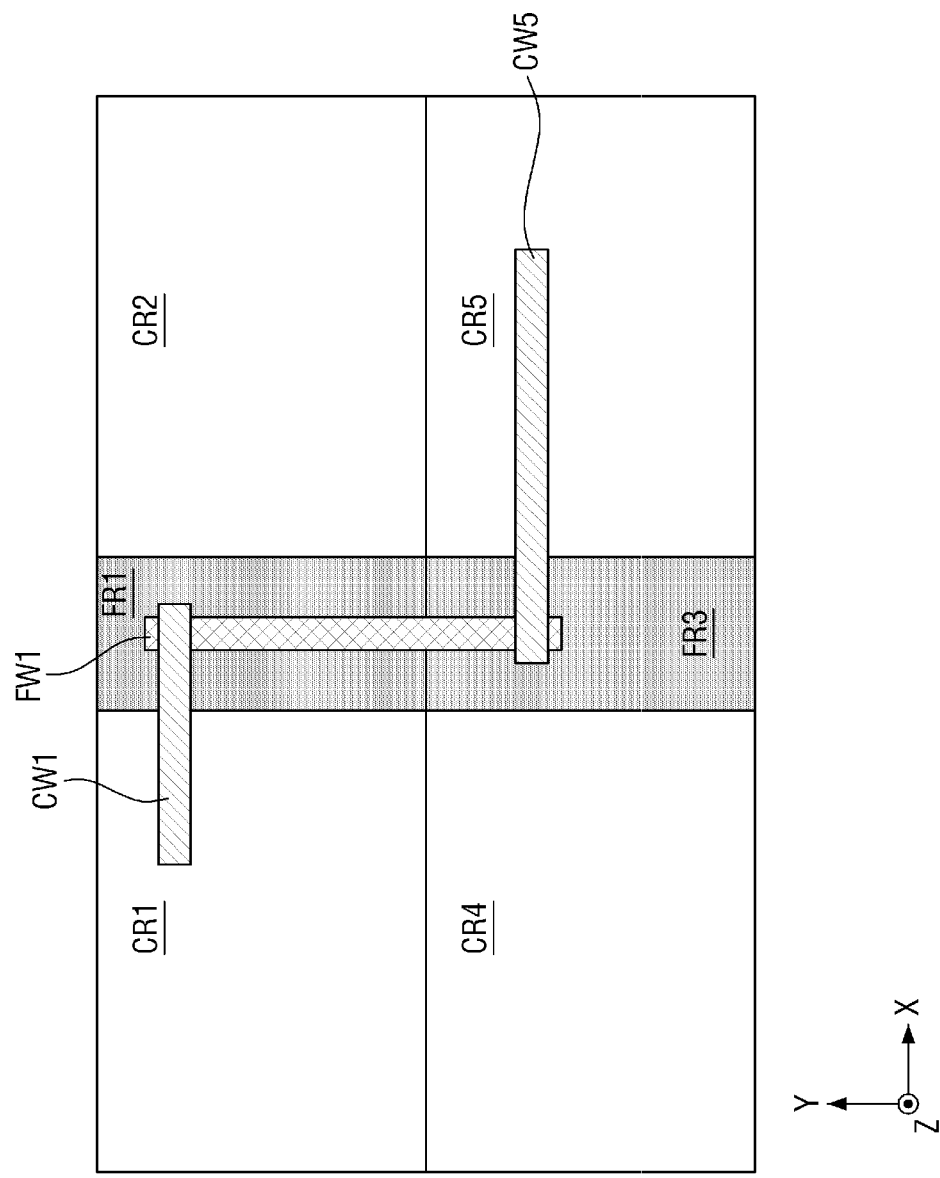
Figure 21:
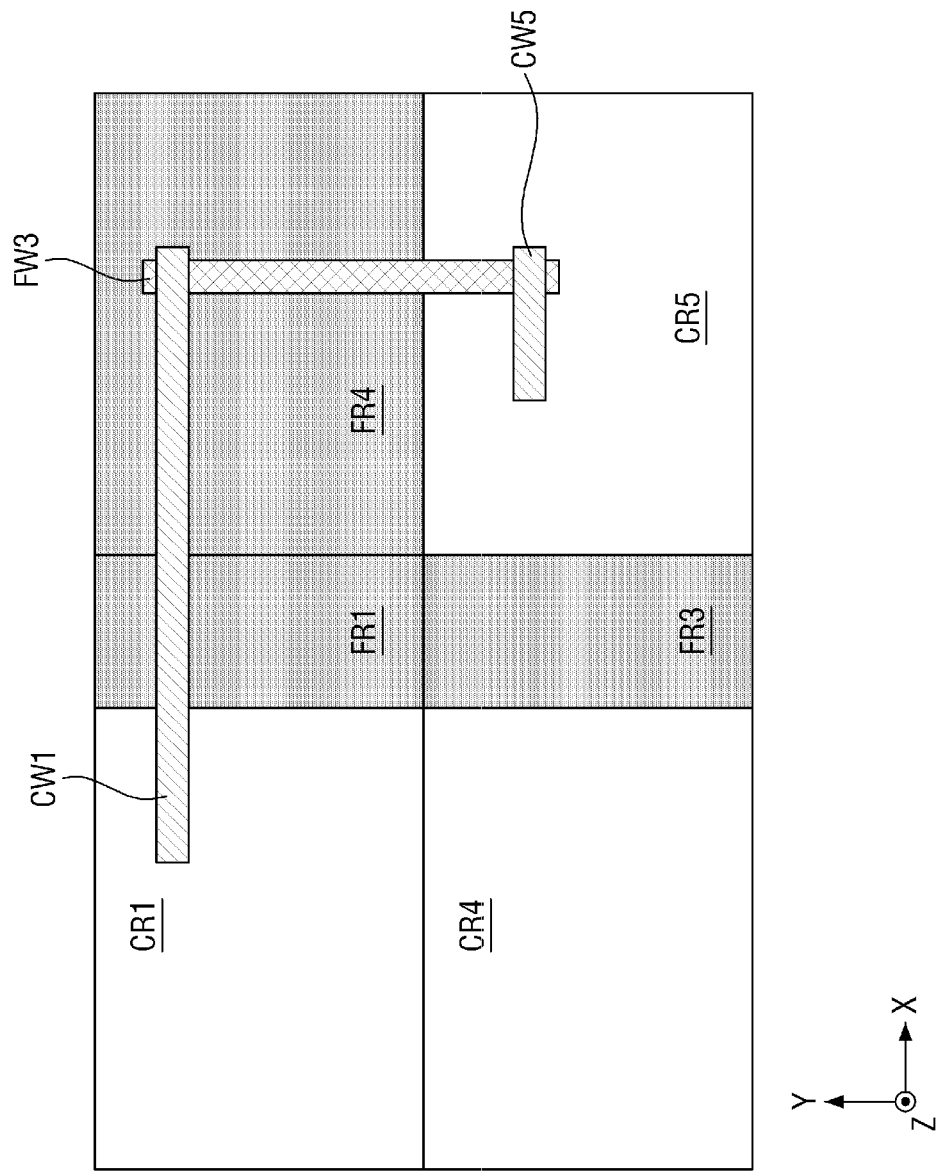

FIGS. 19 to 21 are various example layout diagrams for explaining the function of the filler wiring of the semiconductor device according to some embodiments. For convenience of explanation, repeated parts of the contents explained above using FIGS. 1 to 18 may be briefly explained or omitted.

Referring to FIG. 19, the semiconductor device according to some embodiments further includes a third cell region CR3 and a second filler region FR2.

A standard cell provided by the cell library may be provided in the third cell region CR3. As an example, various standard cells such as NAND cells, NOR cells, and XOR cells may be provided in the third cell region CR3. The second filler region FR2 may be a dummy cell region that is in (e.g., that fills) an empty space between the cell regions in which the standard cell is provided.

The second filler region FR2 may be interposed between the second cell region CR2 and the third cell region CR3. For example, the first cell region CR1, the first filler region FR1, the second cell region CR2, the second filler region FR2 and the third cell region CR3 may be sequentially arranged along the first direction X.

In some embodiments, routing wiring (e.g., third connection wiring CW3) of the second cell region CR2 may be routed to the third cell region CR3 through the second filler wiring FW2.

For example, a second filler wiring FW2 that extends in the second direction Y and is connected to the third connection wiring CW3 may be formed in the second filler region FR2. The third connection wiring CW3 may be connected to the routing wiring (for example, the fourth connection wiring CW4) of the third cell region CR3 through the second filler wiring FW2. Accordingly, the second cell region CR2 may provide an output signal to the third cell region CR3 through the second filler wiring FW2 and the fourth connection wiring CW4, or may receive an input signal from the third cell region CR3.

The second filler wiring FW2 may be formed at the same level as or a level lower than the first to fourth connection wirings CW1, CW2, CW3, and CW4. For example, the second filler wiring FW2 may be placed at a level lower than the first routing level M1. Since the second filler wiring FW2 may be similar to the first filler wiring FW1, detailed explanation thereof will not be provided below.

Referring to FIG. 20, the semiconductor device according to some embodiments further includes a fourth cell region CR4, a fifth cell region CR5, and a third filler region FR3.

The fourth cell region CR4 may be arranged with the first cell region CR1 along the second direction Y. The fifth cell region CR5 may be arranged with the second cell region CR2 along the second direction Y. Standard cells provided by the cell library may be provided in each of the fourth cell region CR4 and the fifth cell region CR5. As an example, various standard cells such as a NAND cell, a NOR cell, or an XOR cell may be provided in each of the fourth cell region CR4 and the fifth cell region CR5.

The third filler region FR3 may be interposed between the fourth cell region CR4 and the fifth cell region CR5. For example, the fourth cell region CR4, the third filler region FR3 and the fifth cell region CR5 may be sequentially arranged along the first direction X. The third filler region FR3 may be a dummy cell region that is in (e.g., that fills) an empty space between the cell regions in which the standard cell is provided.

In some embodiments, the routing wiring (e.g., the first connection wiring CW1) of the first cell region CR1 may be routed to the fifth cell region CR5 through the first filler wiring FW1.

For example, the first filler wiring FW1 may extend in the second direction Y over the first filler region FR1 and the third filler region FR3. The first connection wiring CW1 may be connected to the routing wiring (for example, the fifth connection wiring CW5) of the fifth cell region CR5 through the first filler wiring FW1. Accordingly, the first cell region CR1 may provide an output signal to the fifth cell region CR5 through the first filler wiring FW1 and the fifth connection wiring CW5, or may receive an input signal from the fifth cell region CR5.

Referring to FIG. 21, the semiconductor device according to some embodiments further includes a fourth filler region FR4.

The fourth filler region FR4 may be arranged with the first filler region FR1 along the first direction Xl. For example, the first cell region CR1, the first filler region FR1, and the fourth filler region FR4 may be sequentially arranged along the first direction X. Also, the fourth filler region FR4 may be arranged with the fifth cell region CR5 along the second direction Y. The fourth filler region FR4 may be a dummy cell region that is in (e.g., that fills) an empty space between the cell regions in which the standard cell is provided.

In some embodiments, the routing wiring (e.g., the first connection wiring CW1) of the first cell region CR1 may be routed to the fifth cell region CR5 through the third filler wiring FW3.

For example, a third filler wiring FW3 that extends in the second direction Y and is connected to the fifth connection wiring CW5 may be formed in the fourth filler region FR4. Accordingly, the first cell region CR1 may provide an output signal to the fifth cell region CR5 through the third filler wiring FW3 and the fifth connection wiring CW5, or may receive an input signal from the fifth cell region CR5.

The third filler wiring FW3 may be formed at the same level as or a level lower than the first to fifth connection wirings CW1, CW2, CW3, CW4, and CW5. For example, the third filler wiring FW3 may be placed at a level lower than the first routing level M1. Since the third filler wiring FW3 may be similar to the first filler wiring FW1, detailed explanation thereof will not be provided below.

Figure 22:
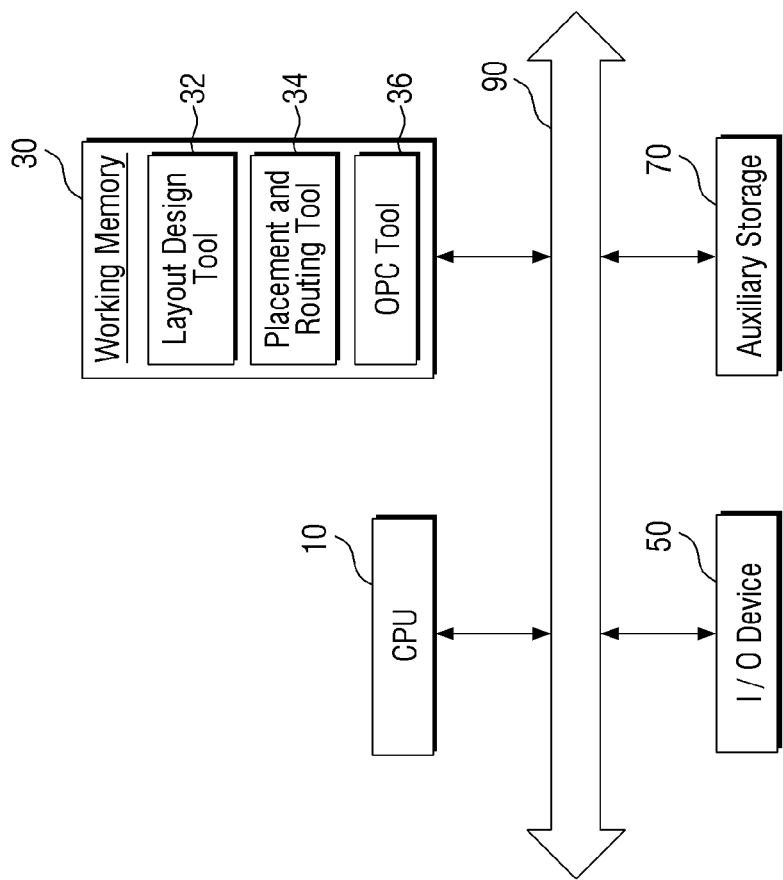
FIG. 22 is a block diagram of a computer system for executing a layout design of a semiconductor device according to some embodiments.

FIG. 22 is a block diagram of a computer system for executing a layout design of a semiconductor device according to some embodiments.

Referring to FIG. 22, the computer system may include a central processing unit (CPU) 10, a working memory 30, an I/O device 50, and an auxiliary storage 70. Here, the computer system may be provided as a dedicated device for layout design of the semiconductor device according to some embodiments. In some embodiments, the computer system may also include various design and verification simulation programs.

The CPU 10 may execute software (application program, operating system, device drivers) to be executed on the computer system. The CPU 10 may execute the operating system to be loaded into the working memory 30. The CPU 10 may execute various application programs to be driven on the basis of the operating system. For example, the CPU 10 may execute a layout design tool 32, a placement and routing tool 34 and/or an optical proximity correction (OPC) tool 36 loaded into the working memory 30.

The operating system or the application program may be loaded into the working memory 30. When the computer system is booted up, an operating system image (not shown) stored in the auxiliary storage 70 may be loaded into the working memory 30 on the basis of the booting sequence. The overall input and output operations of the computer system may be supported by the operating system.

The layout design tool 32 for layout design of the semiconductor device according to some embodiments may be loaded into the working memory 30 from the auxiliary storage 70. Subsequently, the placement and routing tool 34, which places the designed standard cells, rearranges internal wiring patterns in the placed standard cells, and routes the placed standard cells, may be loaded into the working memory 30 from the auxiliary storage 70. Subsequently, an OPC tool 36 for performing optical proximity correction (OPC) of the designed layout data may be loaded into the working memory 30 from the auxiliary storage 70.

The I/O device 50 may control user input and output from the user interface devices. For example, the I/O device 50 may be equipped with a keyboard and a monitor to receive input of information from the user. The user may receive input of information about semiconductor regions and data routes that require adjusted operating characteristics, using the I/O device 50. Further, the processing procedure, the processing result, and the like of the OPC tool 36 may be displayed through the I/O device 50.

The auxiliary storage 70 may be provided as a storage medium of a computer system. The auxiliary storage 70 may store application programs, an operating system image, and various data.

A system interconnector 90 may be a system bus for providing a network inside the computer system. The CPU 10, the working memory 30, the I/O device 50, and the auxiliary storage 70 may be electrically connected to each other and data may be exchanged with each other through the system interconnector 90.

Figure 23:
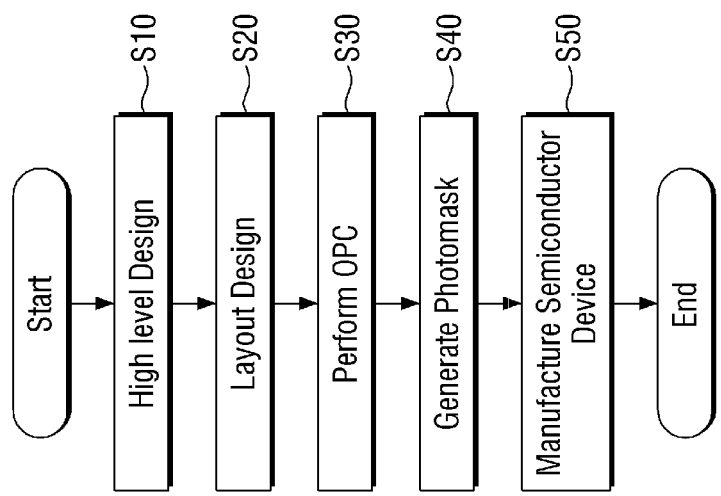
FIG. 23 is a flowchart for explaining a layout design method for the semiconductor device and a method for fabricating the same according to some embodiments.

FIG. 23 is a flowchart for explaining a layout design method for the semiconductor device and a method for fabricating the same according to some embodiments.

Referring to FIG. 23, a high level design of a semiconductor integrated circuit may be performed, using the computer system explained above with reference to FIG. 22 (S10). The high level design may mean that the integrated circuit to be designed is described in a high level language of a computer language. For example, a high level language such as C language may be used for a high level design. The circuits designed by the high level design may be expressed more specifically by register transfer level (RTL) coding or simulation. Subsequently, the code generated by the register transfer level coding is converted into a netlist and may be synthesized into the entire semiconductor element. The synthesized schematic circuit may be verified by a simulation tool, and an adjustment process may be accompanied depending on the verification result.

Subsequently, a layout design for implementing the logically completed semiconductor integrated circuit on the silicon substrate may be executed (S20). For example, the layout design may be performed by referring to the schematic circuit synthesized in the high level design or the netlist corresponding to the circuit. The layout design may include a routing procedure for placing and connecting various standard cells provided from the cell library according to the defined design rules.

The layout may be a procedure for defining the shape and size of a pattern for forming a transistor and metal wirings which are actually formed on the silicon substrate. For example, in order to actually form the inverter circuit on the silicon substrate, layout patterns such as a PFET, a NFET, a P-WELL, an N-WELL, a gate electrode, and wiring patterns to be placed thereon may be appropriately placed.

Subsequently, routing of the selected and placed standard cells may be performed. Specifically, the high level wirings (routing patterns) may be placed on the placed standard cell. By performing the routing, the placed standard cells may be connected to each other according to the design.

After routing, layout verification may be performed to see if there is a part that violates the design rules. Items to be verified may include a DRC (Design Rule Check), an ERC (Electronical Rule Check), a LVS (Layout vs Schematic) and the like.

Subsequently, an optical proximity correction (OPC) procedure may be performed (S30). The layout patterns provided through the layout design may be implemented on the silicon substrate, using a photolithography process. At this time, the optical proximity correction may be a technique for correcting a distortion phenomenon that may occur in the photolithography process.

Subsequently, a photomask may be fabricated on the basis of the layout changed by the optical proximity correction (S40). The photomask may be fabricated, for example, in a manner of drawing layout pattern, using a chrome film coated on a glass substrate.

Subsequently, a semiconductor element may be manufactured, using the generated photomask (S50). In the fabricating process of the semiconductor element using a photomask, various types of exposure and etching processes may be repeated. Through such processes, the shapes of the patterns formed at the time of layout design may be continuously formed on the silicon substrate.

FIGS. 24 to 27 are layout diagrams for explaining the layout design method for the semiconductor device according to some embodiments. For convenience of explanation, repeated parts of the contents explained above using FIGS. 1 to 23 may be briefly explained or omitted.

Figure 24:
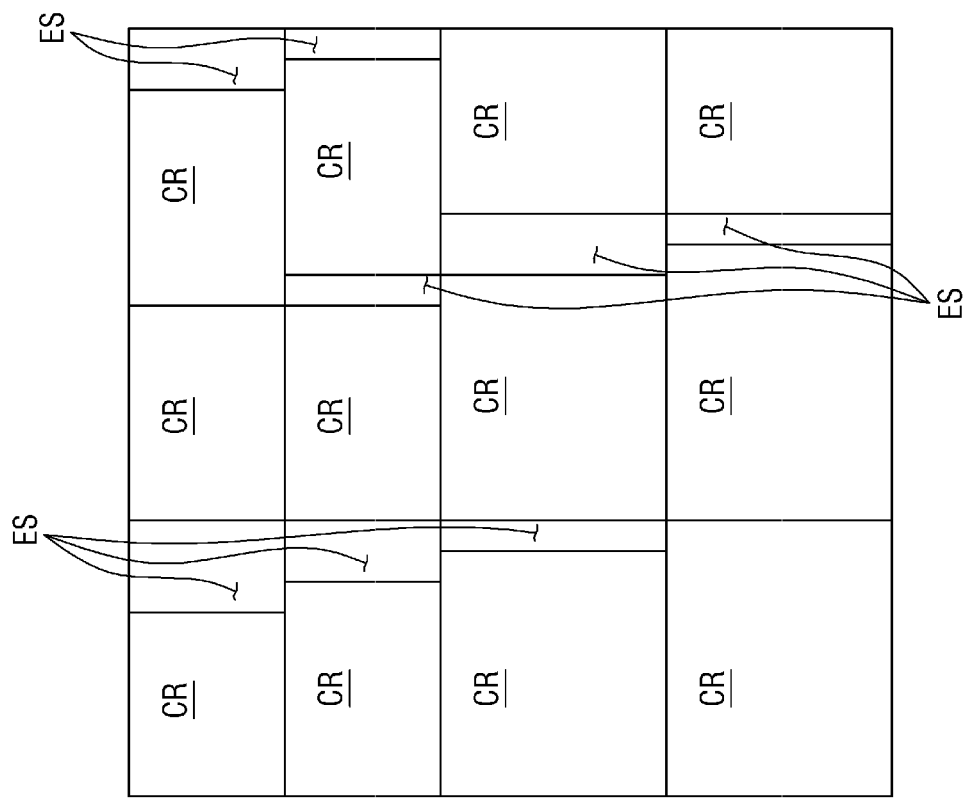
FIGS. 24 to 27 are layout diagrams for explaining the layout design method for the semiconductor device according to some embodiments.

Referring to FIG. 24, the cell regions CR may be placed according to the defined design rules. Various standard cells provided by the cell library may be placed in each cell region CR. As the cell regions CR have various sizes, empty spaces ES may be formed between the placed cell regions CR.

Figure 25:
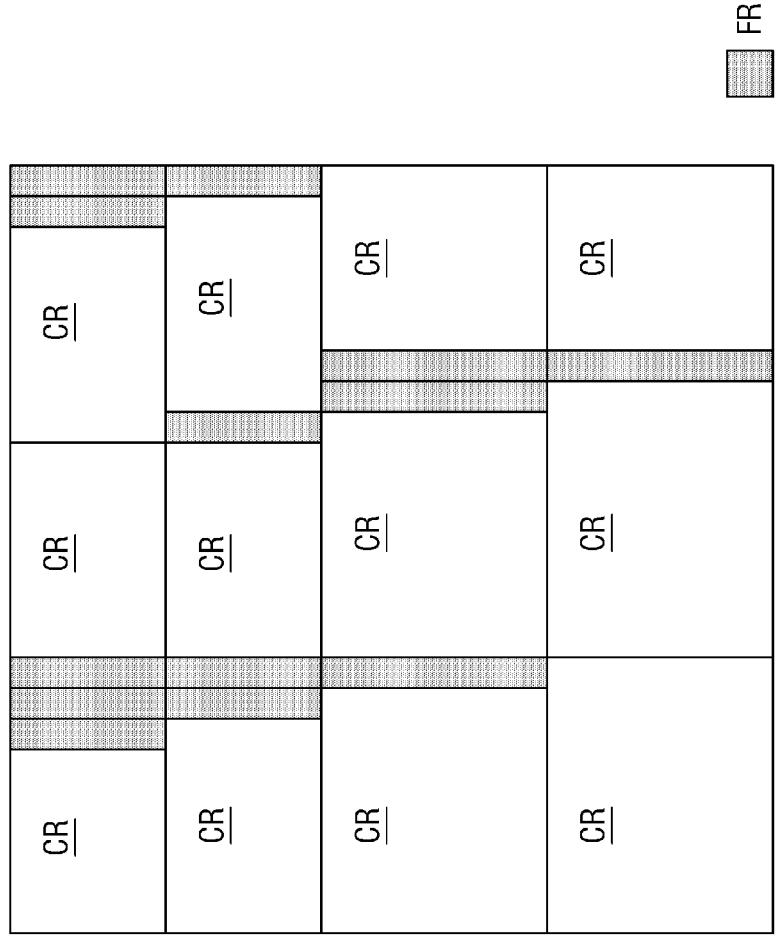
Figure 26A:
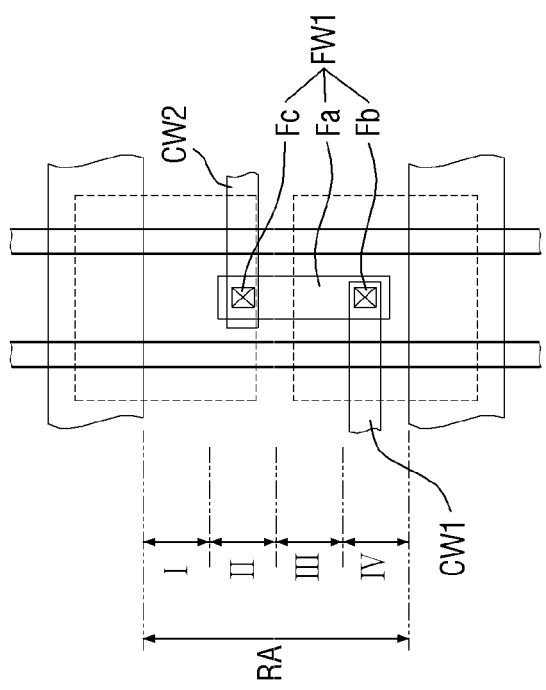
Figure 26D:
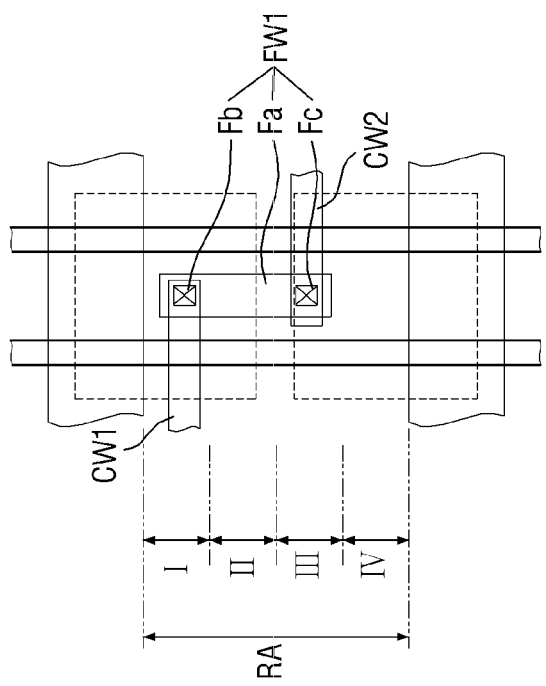

Subsequently, referring to FIG. 25, the filler regions FR may be placed in the empty spaces ES. The filler regions FR may be dummy cell regions that are in (e.g., that fill) the empty spaces ES between the cell regions CR in which the standard cells are provided.

Referring to FIGS. 26A-26F, various cell layouts may be provided in the filler region FR according to the placement of the first connection wiring CW1 and the second connection wiring CW2.

For example, cell layouts according to FIGS. 26A-26F may be provided depending on the placement of the first connection wiring CW1 and the second connection wiring CW2. Various cell layouts shown in FIGS. 26A-26F are merely examples, and the present disclosure is not limited thereto. For example, it goes without saying that the shape and placement of the first filler wiring FW1 may be further varied depending on the placement of the first connection wiring CW1 and the second connection wiring CW2.

Figure 27:
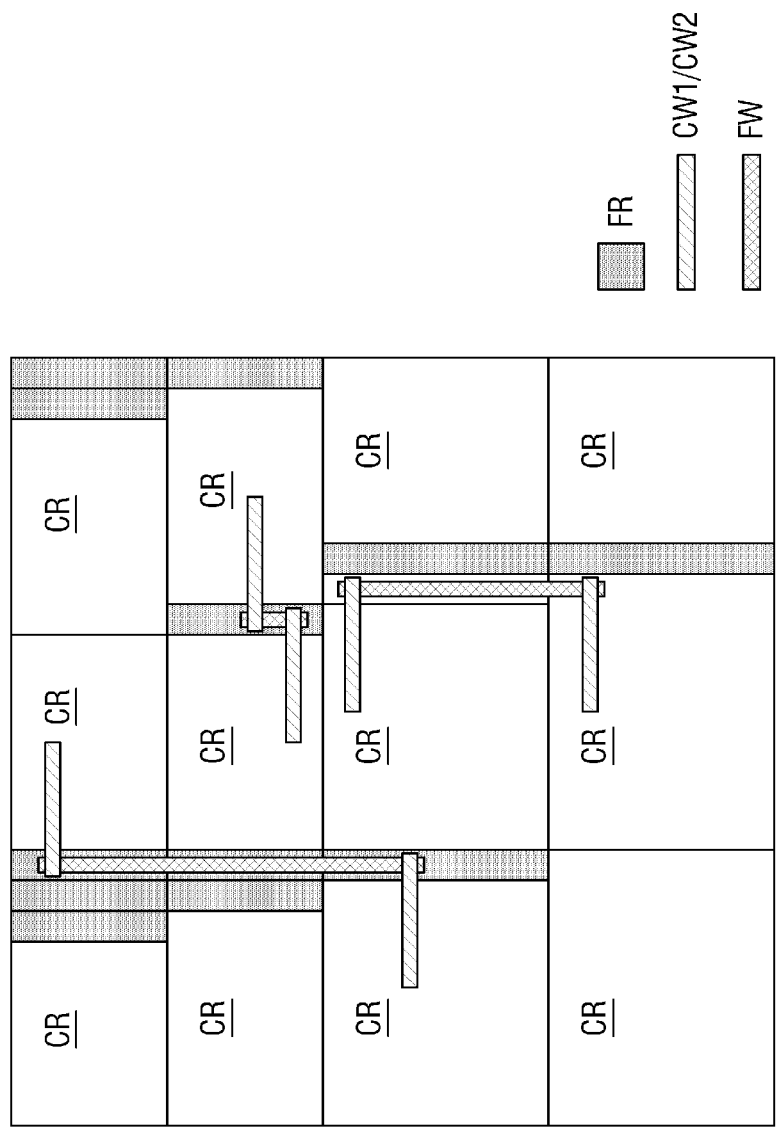

Referring to FIG. 27, various filler wirings FW may be placed in the filler regions FR.

Each of the filler wirings FW may be, for example, one of the first filler wirings FW1 explained above in the description of FIG. 26. Accordingly, it is possible to provide a layout design method for a semiconductor device in which a power loss and PnR resource loss are reduced.

While the present inventive concept has been particularly shown and described with reference to example embodiments thereof, it will be understood by those of ordinary skill in the art that various changes in form and details may be made therein without departing from the scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device including a first cell region and a filler region that are adjacent each other in a first direction, the semiconductor device comprising:
an active pattern extending in the first direction, inside the first cell region;
a gate electrode extending in a second direction intersecting the first direction, on the active pattern;
a gate contact that is on and electrically connected to an upper surface of the gate electrode;
a source/drain contact that is on and electrically connected to a source/drain region of the active pattern, adjacent a side of the gate electrode;

a connection wiring that extends in the first direction over the first cell region and the filler region, and that is on and electrically connected to one of the gate contact or the source/drain contact; and a filler wiring that extends in the second direction and that is on and electrically connected to the connection wiring, inside the filler region, wherein an upper surface of the gate contact and an upper surface of the source/drain contact are coplanar, and wherein a height of an upper surface of the filler wiring is equal to or lower than a height of an upper surface of the connection wiring.

2. The semiconductor device of claim 1, further comprising:

a first connection contact that is on and electrically connected to the upper surface of the gate contact;

a second connection contact that is on and electrically connected to the upper surface of the source/drain contact; and a routing via that is on and electrically connected to one of an upper surface of the first connection contact or an upper surface of the second connection contact, the connection wiring being on and electrically connected to an upper surface of the routing via.

3. The semiconductor device of claim 2, wherein the filler wiring includes a filler contact that has an upper surface coplanar with the upper surface of the first connection contact and the upper surface of the second connection contact.

4. The semiconductor device of claim 2, wherein the filler wiring includes a filler via that has an upper surface coplanar with the upper surface of the routing via.

5. The semiconductor device of claim 1, wherein the upper surface of the filler wiring is coplanar with the upper surface of the connection wiring.

6. The semiconductor device of claim 1, further comprising:

a routing via that is on and electrically connected to the upper surface of the connection wiring; and a routing wiring that extends in the second direction and that is on and electrically connected to an upper surface of the routing via.

7. The semiconductor device of claim 1, further comprising:

a first cell separation film that extends in the second direction between the first cell region and the filler region, wherein the filler region comprises a dummy cell region, and wherein the filler wiring is confined to the dummy cell region.

8. The semiconductor device of claim 7, further comprising:

a second cell separation film that extends in the second direction to define the filler region, wherein the filler region is between the first cell separation film and the second cell separation film, and wherein the first cell separation film and the second cell separation film are spaced apart from each other by 1 gate pitch.

9. The semiconductor device of claim 1, wherein the active pattern includes a fin-type pattern protruding from an upper surface of a substrate.

10. The semiconductor device of claim 1, wherein the active pattern includes a plurality of wire patterns spaced apart from each other on a substrate.

11. A semiconductor device that includes a first cell region and a second cell region that are spaced apart from each other in a first direction, and a filler region between the first cell region and the second cell region, the semiconductor device comprising:

a gate electrode extending in a second direction intersecting the first direction, inside the first cell region;

a source/drain contact adjacent a side of the gate electrode;

a first connection wiring that extends in the first direction over the first cell region and the filler region and that is on and electrically connected to the source/drain contact;

a second gate electrode extending in the second direction, inside the second cell region;

a gate contact that is on and electrically connected to an upper surface of the second gate electrode;

a second connection wiring that extends in the first direction over the filler region and the second cell region and that is on and electrically connected to the gate contact; and a filler wiring extending in the second direction to connect the first connection wiring and the second connection wiring, inside the filler region, wherein the first connection wiring and the second connection wiring are at a first routing level, and wherein the filler wiring comprises a portion that is at a level that is lower than the first routing level.

12. The semiconductor device of claim 11, further comprising:

a first connection contact that is on and electrically connected to an upper surface of the source/drain contact;

a second connection contact that is on and electrically connected to an upper surface of the gate contact;

a first routing via that electrically connects an upper surface of the first connection contact and a lower surface of the first connection wiring; and a second routing via that electrically connects an upper surface of the second connection contact and a lower surface of the second connection wiring.

13. The semiconductor device of claim 12, wherein the filler wiring includes:

a filler contact at a same level as the first connection contact and the second connection contact;

a first filler via that is on a first portion of an upper surface of the filler contact and that electrically connects the filler contact and the lower surface of the first connection wiring; and a second filler via that is on a second portion of the upper surface of the filler contact and that electrically connects the filler contact and the lower surface of the second connection wiring.

14. The semiconductor device of claim 12, wherein the filler wiring is at a same level as the first and second routing vias.

15. The semiconductor device of claim 11, wherein the portion of the filler wiring that is at the level that is lower than the first routing level is a first portion that comprises a via, and wherein the filler wiring further comprises a second portion comprising a routing wiring that is at the first routing level.

16. The semiconductor device of claim 11, further comprising:
a routing wiring that is on and electrically connected to the first connection wiring and that is at a second routing level that is higher than the first routing level.

17. A semiconductor device comprising:
a first power supply wiring and a second power supply wiring that extend in parallel in a first direction;
a first cell separation film, a second cell separation film, and a third cell separation film that are spaced apart from each other in the first direction and that extend in parallel in a second direction intersecting the first direction;
a first active pattern extending in the first direction, between the first power supply wiring and the second power supply wiring;
a first gate electrode extending in the second direction, between the first cell separation film and the second cell separation film;
a first source/drain contact that is on and electrically connected to a first source/drain region of the first active pattern, adjacent a side of the first gate electrode;
a first connection contact that is on and electrically connected to an upper surface of the first source/drain contact;
a first routing via that is on and electrically connected to an upper surface of the first connection contact;
a first routing wiring that extends in the first direction and that is on and electrically connected to an upper surface of the first routing via;
a second routing via that is on and electrically connected to an upper surface of the first routing wiring;
a second routing wiring that extends in the second direction and that is on and electrically connected to an upper surface of the second routing via; and
a filler wiring that extends in the second direction and that is on and electrically connected to the first routing wiring, between the second cell separation film and the third cell separation film,
wherein a height of an upper surface of the filler wiring is equal to or lower than a height of the upper surface of the first routing wiring.

18. The semiconductor device of claim 17, further comprising:
a second active pattern extending in the first direction, between the first power supply wiring and the first active pattern;
a second gate electrode extending in the second direction, between the first cell separation film and the first gate electrode; and
a second source/drain contact that is on and electrically connected to a second source/drain region of the second active pattern, adjacent a side of the second gate electrode,
wherein the second source/drain contact is electrically connected to the filler wiring through the first routing via, the first routing wiring, the second routing via, and the second routing wiring.

19. The semiconductor device of claim 18, wherein the first active pattern is in an NFET region, and the second active pattern is in a PFET region.

20. The semiconductor device of claim 17, wherein the second cell separation film and the third cell separation film are spaced apart from each other by a distance of 60 nanometers or less.

* * * * *